(12) United States Patent
Abe

(10) Patent No.: US 8,707,548 B2
(45) Date of Patent: Apr. 29, 2014

(54) ELECTRONIC COMPONENT MOUNTING APPARATUS

(75) Inventor: Tomotaka Abe, Tokyo (JP)

(73) Assignee: Juki Corporation, Tama-shi, Tokyo (JP)

( * ) Notice: Subject to any disclaimer, the term of this patent is extended or adjusted under 35 U.S.C. 154(b) by 0 days.

(21) Appl. No.: 13/477,426

(22) Filed: May 22, 2012

(65) Prior Publication Data

US 2013/0008019 A1   Jan. 10, 2013

(30) Foreign Application Priority Data

May 26, 2011   (JP) .................................. 2011-118306

(51) Int. Cl.
  *B23P 21/00*   (2006.01)
(52) U.S. Cl.
  USPC .................. 29/720; 29/721; 29/740; 29/741; 29/742; 29/832
(58) Field of Classification Search
  USPC ........... 29/740–743, 832–834, 720–721, 705; 414/737, 752.1–752.4; 901/45–47; 294/64.2
  See application file for complete search history.

(56) References Cited

U.S. PATENT DOCUMENTS

| 5,541,843 | A  | * | 7/1996  | Yamaguchi et al. ............ 701/86 |
| 6,216,341 | B1 | * | 4/2001  | Nakahara ....................... 29/833 |
| 6,519,838 | B1 | * | 2/2003  | Okuda et al. .................... 29/740 |
| 6,902,090 | B2 | * | 6/2005  | Yamamura et al. ............. 226/32 |
| 7,458,147 | B2 | * | 12/2008 | Kawase et al. .................. 29/833 |
| 7,559,134 | B2 | * | 7/2009  | Gaida ............................. 29/720 |
| 7,706,595 | B2 | * | 4/2010  | Bushman et al. ............ 382/141 |
| 8,359,735 | B2 | * | 1/2013  | Ban et al. ........................ 29/740 |
| 2012/0233852 | A1 | * | 9/2012 | Abe et al. ........................ 29/739 |
| 2013/0008019 | A1 | * | 1/2013 | Abe ................................ 29/720 |

FOREIGN PATENT DOCUMENTS

| JP | 10-341096   | 12/1998 |
| JP | 2004-200296 | 7/2004  |
| JP | 2004-228442 | 8/2004  |

* cited by examiner

*Primary Examiner* — Minh Trinh
(74) *Attorney, Agent, or Firm* — Drinker Biddle & Reath LLP

(57) ABSTRACT

An electronic component mounting apparatus includes a head unit, component supply device, camera unit, and controller controlling the head unit and component supply device. The component supply device has a holder holding electronic component accommodating tapes, each having storage cells arranged in a row, the storage cells storing electronic components, and a feeder forwarding the electronic component accommodating tapes and moving the storage cells to a suction area where the electronic component can be suctioned by the nozzle. The camera unit is fixed to a head support, and captures an image of the suction area. The controller analyzes the image of the suction area obtained by the camera unit. When the controller determines that a portion of the electronic component accommodating tape in the suction area is a spliced portion based on a result of the analysis, the controller determines that the electronic component accommodating tape is changed.

13 Claims, 12 Drawing Sheets

ELECTRONIC COMPONENT MOUNTING APPARATUS

CROSS-REFERENCE TO RELATED APPLICATIONS

This application claims priority to Japanese Patent Application No. 2011-118306 filed on May 26, 2011, the entire content of which is incorporated herein by reference.

TECHNICAL FIELD

The present invention relates to an electronic component mounting apparatus configured to suction an electronic component by a nozzle, move the electronic component and to mount the electronic component on a board.

BACKGROUND

An electronic component mounting apparatus has a head having a nozzle, suctions an electronic component by the nozzle, and mounts the electronic component on a board. The electronic component apparatus is configured to suction the electronic component in a component supply device by moving the nozzle of the head in a direction orthogonal to the surface of the board, and to subsequently move the head relatively in a direction parallel to the surface of the board until the nozzle reaches the mounting position of the electronic component where the nozzle of the head is moved in the direction orthogonal to the surface of the board so as to approach the board, thereby mounting the electronic component on the board.

Related art electronic component mounting apparatuses include means for checking the electronic components held by an electronic component accommodating tape that is loaded in a feeder of the component supply device. JP2004-200296A describes a mismounting prevention system provided in an electronic component mounting apparatus in which, when attaching the electronic component accommodating tape to the tape feeder of the component supply device, in order to detect the electronic components prepared in positions in the component supply device, a bar code adhered to the electronic component accommodating tape is read and whether the electronic component accommodating tape is appropriate is determined based on the read information. In this system, by using a bar code recognition system and identifying the type of the electronic component accommodating tape by the bar code, the occurrence of mismounting of electronic components on the board is reduced.

JP10-341096A and JP2004-228442A describe to replenish the component supply device with electronic components by a so-called splicing method in which when the number of remaining components accommodated in one electronic component accommodating tape becomes small, the front end of an electronic component accommodating tape accommodating components of the same kind is connected to the rear end of the previous electronic component accommodating tape for replenishment of components. JP10-341096A and JP2004-228442A also describe means for detecting that the electronic component accommodating tape is changed.

JP10-341096A describes to provide a sensor that detects the connection part of electronic component accommodating tapes, and to detect a mark formed in the connection part by the sensor to detect the connection part of the electronic component accommodating tapes, thereby detecting that the electronic component accommodating tape is changed. JP2004-228442A describes to detect whether there is an electronic component in each electronic component storage cell of the electronic component accommodating tape and to determine that the electronic component accommodating tape is changed when storage cells are continuously empty for a given number of times.

By changing the electronic component accommodating tape and replenishing electronic components by the splicing method, the component supply device can be replenished with electronic components without production being stopped, so that the operation rate of the electronic component mounting apparatus can be increased.

In the system described in JP2004-200296A, since the mounting work is stopped to change the tape feeder each time electronic components on the electronic component accommodating tape of the component supply device run out, the improvement of work efficiency is limited. In a case in which the electronic component accommodating tape is changed to replenish electronic components by the splicing method, since electronic component accommodating tapes are connected, even though the information on the electronic component accommodating tape is read from the bar code, it is difficult to synchronize with the timing of change of the electronic component accommodating tape.

According to the method described in JP10-341096A, since the electronic component mounting apparatus is provided with a sensor (for example, an optical sensor) in order to detect the connection part of electronic component accommodating tapes, it is necessary to provide each component supply device with a sensor that detects the connection part of electronic component accommodating tapes. Moreover, in the component supply device, a plurality of feeders are each mounted with an electronic component accommodating tape. Thus, to provide an optical sensor for each, the number of components of the apparatus increases, so that the size of the electronic component mounting apparatus increases. Moreover, according to the method in which a mark is detected by an optical sensor, trouble or malfunction may occur due to adhesion of dirt, so that detection accuracy is not stable.

According to the method described in JP2004-228442A, the empty cell determination is made based on an idle operation accompanied by a movement of the suction nozzle and the result of detection by a height sensor or the like. Thus, detection takes time and reduces work efficiency. Moreover, change of the electronic component accommodating tape cannot be detected unless the number of empty cells at the connection part of the electronic component accommodating tapes is fixed.

SUMMARY OF THE INVENTION

An object of the present invention is to provide an electronic component mounting apparatus capable of appropriately detecting a connection part of electronic component accommodating tapes, and capable of efficiently mounting an electronic component with high accuracy.

According to an aspect of the present invention, an electronic component mounting apparatus is configured to mount an electronic component on a board. The electronic component mounting apparatus includes a head unit having a nozzle configured to suction the electronic component, a nozzle driver configured to drive the nozzle, and a head support supporting the nozzle and the nozzle driver; a component supply device having a holder configured to hold a plurality of electronic component accommodating tapes, each having storage cells arranged in a row, the storage cells storing electronic components, and a feeder configured forward the electronic component accommodating tapes and to move the storage cells to a suction area where the electronic component can be suctioned by the nozzle; a camera unit fixed to the head support to capture an image of the suction area; and a controller configured to controls operations of the head unit and the component supply device. The controller is configured to analyze the image of the suction area in the component supply device obtained by the camera unit, determine whether a portion of the electronic component accommodating tape in the suction area is a spliced portion based on a result of the analysis, and to determine that the electronic component accommodating tape is changed if the portion of the electronic component accommodating tape in the suction area is determined to be the spliced portion.

Other aspects and advantages of the present invention will be apparent from the following description, drawings and the claims:

DETAILED DESCRIPTION

Hereinafter, an embodiment of the present invention will be described in detail with reference to the drawings. The present invention is not limited by the embodiment described below. Elements in the embodiment described below include elements that can be easily envisioned by one of ordinary skill in the art and elements that are substantially the same thereto. Further, elements disclosed in the embodiment described below may be combined as appropriate.

Figure 1:
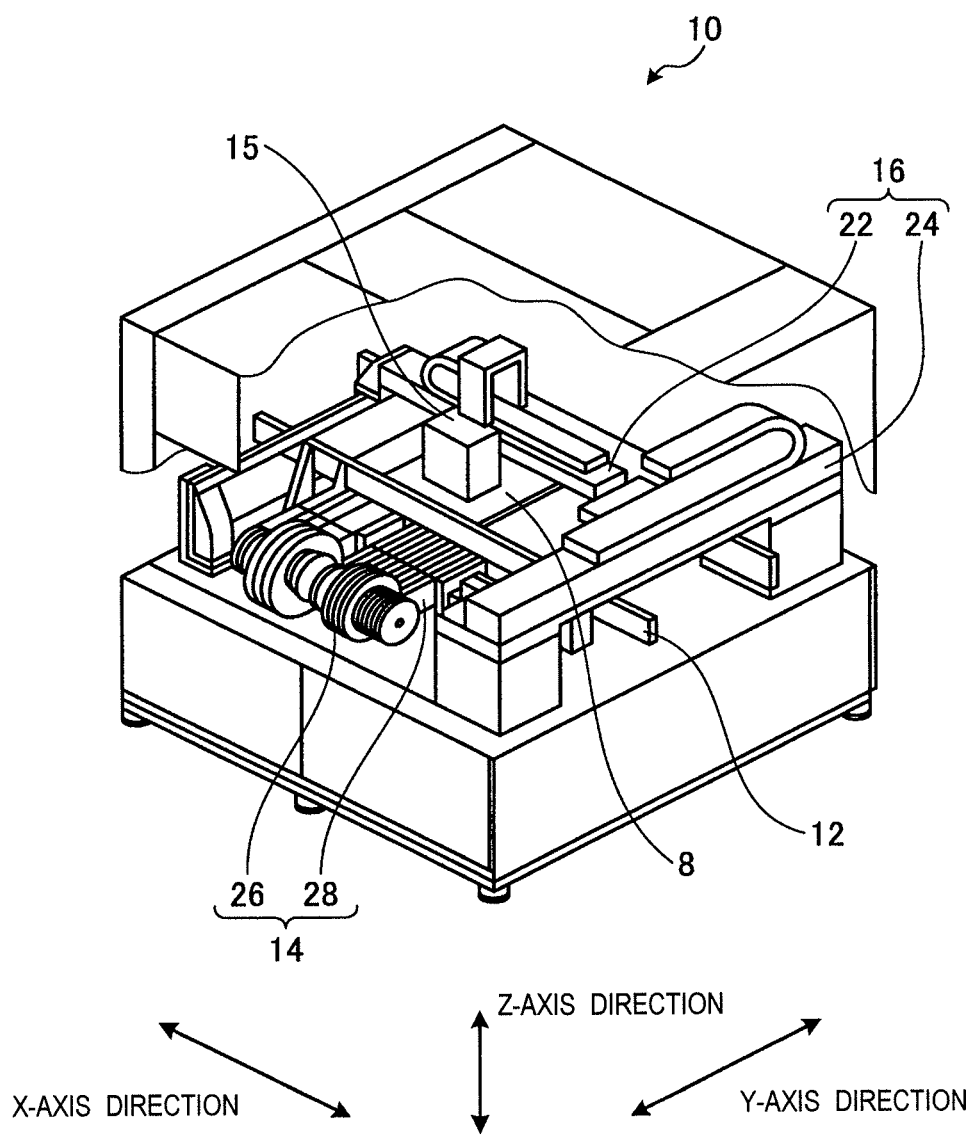
FIG. 1 is a perspective view illustrating a schematic structure of an electronic component mounting apparatus.

FIG. 1 is a perspective view illustrating a schematic structure of an electronic component mounting apparatus.

The electronic component mounting apparatus 10 shown in FIG. 1 is an apparatus that mounts an electronic component on a board 8. The electronic component mounting apparatus 10 has a base conveyer 12, a component supply device 14, a head 15 and an XY movement mechanism 16. It is necessary for the board 8 only to be a member where an electronic component is mounted, and the structure thereof is not specifically limited. The board 8 of the present embodiment is a plate-like member, and has a wiring pattern provided on the surface thereof. A solder as a joining member that joins the wiring pattern of the plate-like member and the electronic component by reflow adheres to the surface of the wiring pattern provided on the board 8.

The base conveyer 12 is an example of a conveyer that conveys the board 8 to a position where a head unit 30 of the head 15 mounts an electronic component on the board 8. The base conveyer 12 conveys the board 8 in the X-axis direction in the figure. The base conveyer 12 has a rail that extends in the X-axis direction and a conveyance mechanism that supports the board 8 and moves the board 8 along the rail. The base conveyer 12 conveys the board 8 in the X-axis direction by moving the board 8 along the rail by the conveyance mechanism in an orientation where the mounting surface of the board 8 faces the head 15. The base conveyer 12 conveys, to a given position on the rail, the board 8 supplied from an apparatus that supplies the board 8 to the electronic component mounting apparatus 10. The head 15 mounts the electronic component on the surface of the board 8 at the given position. After the electronic component is mounted on the board 8 conveyed to the given position, the base conveyer 12 conveys the board 8 to an apparatus that performs the next process. As the conveyance mechanism of the base conveyer 12, various structures may be used. For example, a belt conveyance mechanism where the conveyance mechanism is made one unit may be used in which a rail disposed along the conveyance direction of the board 8 and an endless belt that rotates along the rail are combined and the board 8 is conveyed in a state of being mounted on the endless belt.

The component supply device 14 has a holder 26 that holds a number of electronic components to be mounted on the board 8 and a feeder 28 that enables the electronic components held by the holder 26 to be supplied to the head 15, that is, enables the electronic components to be suctioned by the head 15. The component supply device 14 supplies electronic components to the head 15 by using an electronic component accommodating tape formed by bonding electronic components to a tape. The electronic component accommodating tape has a plurality of storage cells formed on the tape, and electronic components are stored in the storage cells. The holder 26 holds a plurality of electronic component accommodating tapes. The feeder 28 (tape feeder) forwards the electronic component accommodating tapes that the holder 26 holds, and moves the storage cells to a suction area where the electronic components can be suctioned by the nozzles of the head 15. By moving the storage cells to the suction area, the electronic components accommodated in the storage cells are exposed in a given position, and the electronic components can be suctioned by the nozzles of the head 15. It is advantageous that the component supply device 14 is detachably attachable to the apparatus main body.

The head 15 suctions the electronic components held by the component supply device 14, and mounts the suctioned electronic components on the board 8 moved to the given position by the base conveyer 12.

The XY movement mechanism 16 is an example of a movement mechanism that moves the head unit 30 of the head 15 along a plane parallel to the surface of the board 8. The XY movement mechanism 16 moves the head 15 in the X-axis direction and the Y-axis direction (see FIG. 1). The XY movement mechanism 16 has an X-axis driver 22 and a Y-axis driver 24. The X-axis driver 22 is coupled to the head 15, and moves the head 15 in the X-axis direction. The Y-axis driver 24 is coupled to the head 15 through the X-axis driver 22, and moves the head 15 in the Y-axis direction by moving the X-axis driver 22 in the Y-axis direction. The XY movement mechanism 16 is capable of moving the head 15 to a position where the head 15 faces the board 8 or to a position where the head 15 faces the feeder 28 of the component supply device 14 by moving the head 15 in the X- and Y-axis directions. The XY movement mechanism 16 adjusts the relative position of the head 15 and the board 8 by moving the head 15. Thereby, the electronic components held by the head 15 can be moved to a given position of the surface of the board 8, and the electronic components can be mounted on the given position of the surface of the board 8. As the X-axis driver 22, various mechanisms that move the head 15 in a predetermined direction may be used. As the Y-axis driver 24, various mechanisms that move the X-axis driver 22 in a predetermined direction may be used. As the mechanism that moves the object in a predetermined direction, for example, a linear motor, a rack-and-pinion, a conveyance mechanism using a ball screw or a conveyance mechanism using a belt may be used.

Figure 2:
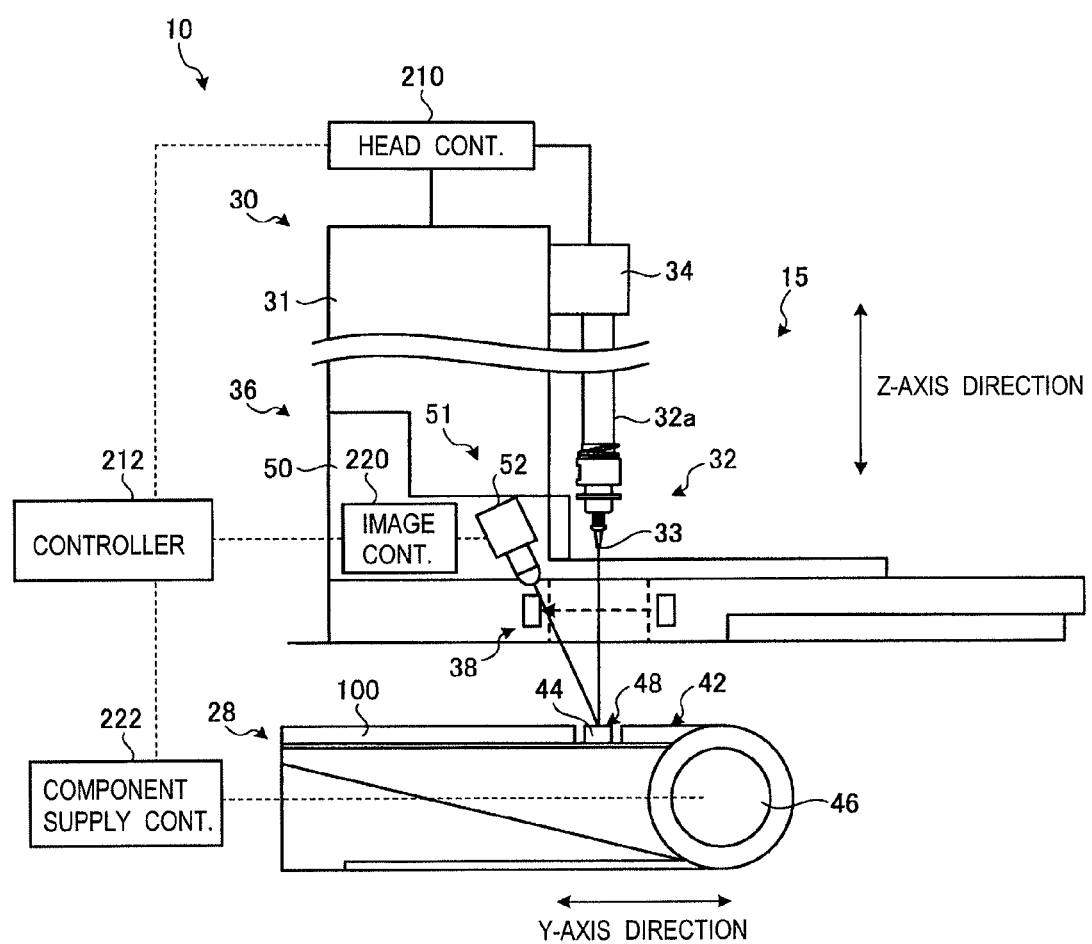
FIG. 2 is a schematic view illustrating a schematic structure of a head of the electronic component mounting apparatus.
Figure 3:
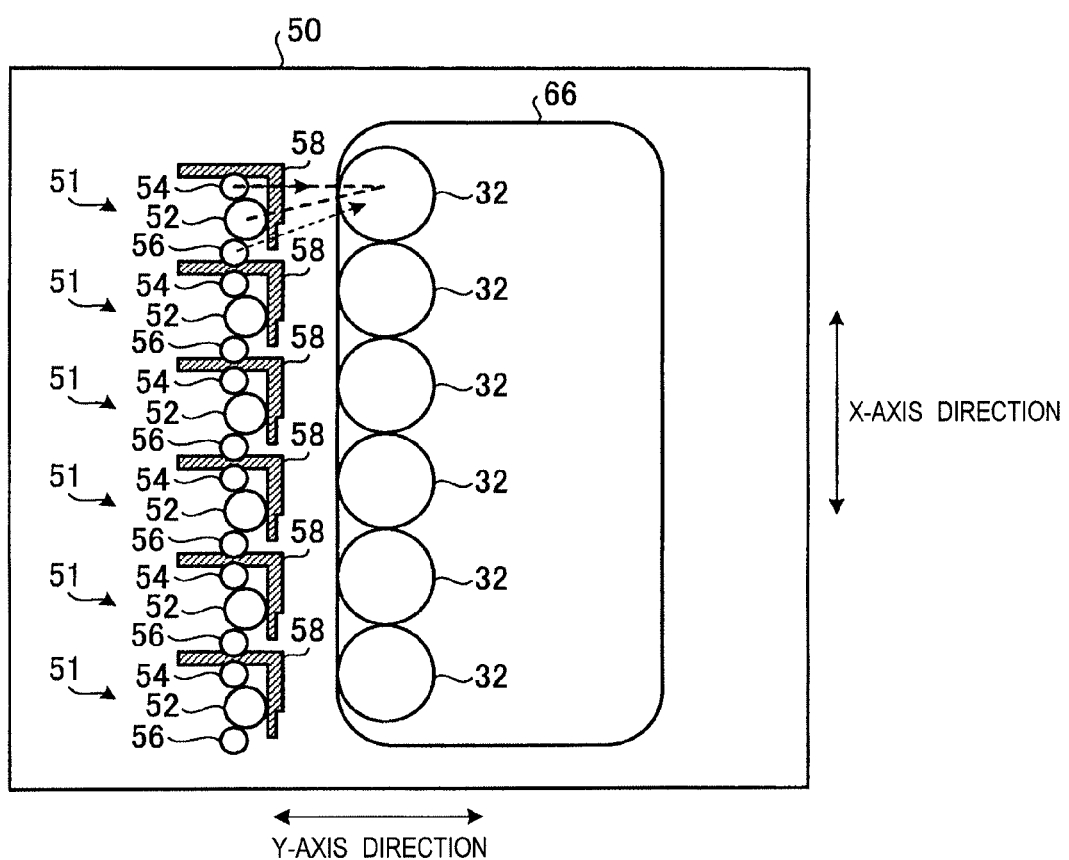
FIG. 3 is a top view illustrating a schematic structure of a camera unit and nozzles of the head shown in FIG. 2.

Next, the structure of the head 15 will be described by using FIG. 2 and FIG. 3. FIG. 2 is a schematic view illustrating the schematic structure of the head of the electronic component mounting apparatus. FIG. 3 is a top view illustrating the schematic structure of a camera unit and nozzles of the head shown in FIG. 2. FIG. 2 also shows various controllers that control the electronic component mounting apparatus 10 and part of the feeder 28 of the component supply device 14. The head 15 has, as shown in FIG. 2, the head unit 30, the camera unit 36 and a laser recognition device 38. The electronic component mounting apparatus 10 has a head controller 210, a controller 212, an imaging controller 220 and a component supply controller 222. The head controller 210, the controller 212, the imaging controller 220 and the component supply controller 222 will be described later.

The surface of the feeder 28 that faces the head 15 is covered with an upper cover 42, and electronic components 44 held and stored by the electronic component accommodating tape 100 are exposed out of an opening formed in the upper cover 42. The feeder 28 has a draw-out mechanism 46 for the electronic component accommodating tape 100 held by the holder 26. The feeder 28 draws out the electronic component accommodating tape 100 held by the holder 26 by the draw-out mechanism 46 and moves it to thereby moves the electronic components 44 held by the electronic component accommodating tape 100 to the opening of the upper cover 42. In the present embodiment, the opening of the upper cover 42 serves as the suction area 48 where the nozzles of the head 15 suction the electronic components held by the electronic component accommodating tape 100.

The head unit 30 has a head support 31 that supports members, a plurality of nozzles 32 and a nozzle driver 34. On the head unit 30 of the present embodiment, as shown in FIG. 3, six nozzles 32 are arranged in one row. The six nozzles 32 are aligned in a direction parallel to the X axis.

The head support 31 is a support member coupled to the X-axis driver 22, and supports the nozzles 32 and the nozzle driver 34. The head support 31 also supports the camera unit 36 and the laser recognition device 38.

The nozzle 32 is a suction mechanism that suctions and holds the electronic component 44. The nozzle 32 has an opening 33 at the tip thereof, and suctions and holds the electronic component 44 at the tip by suctioning air through the opening 33. The nozzle 32 has a shaft 32a coupled to the tip portion where the opening 33 is formed and that suctions the electronic component 44. The shaft 32a is a rod-like member that supports the tip portion, and is disposed so as to extend in the Z-axis direction. Inside the shaft 32a, an air pipe (piping) that connects the opening 33 and the suction mechanism of the nozzle driver 34 is disposed.

The nozzle driver 34 moves the nozzle 32 in the Z-axis direction, and causes the electronic component 44 to be suctioned by the opening 33 of the nozzle 32. Here, the Z axis is an axis orthogonal to the XY plane. The Z axis is a direction orthogonal to the surface of the board. The nozzle driver 34 rotates the nozzle 32 in a θ direction when the electronic component is mounted or the like. The θ direction is, namely, a direction parallel to the circumferential direction of a circle centered around the Z axis which is an axis parallel to the direction in which a Z-axis driver moves the first suction portion and the second suction portion. The θ direction is a rotation direction of the nozzle 32.

The nozzle driver 34 moves the nozzle 32 in the Z-axis direction. For example, the nozzle driver 34 has a linear motor. The nozzle driver 34 moves the opening 33 at the tip portion of the nozzle 32 in the Z-axis direction by moving the shaft 32a of the nozzle 32 in the Z-axis direction by the linear motor. Moreover, the nozzle driver 34 rotates the nozzle 32 in the θ direction. For example, the nozzle driver 34 has a transmission element coupled to the motor and the shaft 32a. The nozzle driver 34 also rotates the tip portion of the nozzle 32 in the θ direction by transmitting the driving force outputted from the motor to the shaft 32a by the transmission element and rotating the shaft 32a in the θ direction.

The nozzle driver 34 is provided with a mechanism that causes the electronic component 44 to be suctioned by the opening 33 of the nozzle 32, that is, a suction mechanism. The suction mechanism has, for example, an air pipe coupled to the opening 33 of the nozzle 32, a pump connected to the air pipe and an electromagnetic valve that switches between opening and closing of the pipeline of the air pipe. The nozzle driver 34 suctions air in the air pipe by the pump, and switches whether to suction air from the opening 33 or not by switching between opening and closing of the electromagnetic valve. The nozzle driver 34 causes the electronic component 44 to be suctioned by the opening 33 by opening the electromagnetic valve and suctioning air from the opening 33, and releases the electronic component 44 suctioned by the opening 33, that is, brings about a condition where the electronic component 44 is not suctioned by the opening 33 by closing the electromagnetic valve and not suctioning air from the opening 33.

The head unit 30 may be further provided with a distance sensor that moves together with the head support 31 and detects the distance from the board 8 which is a member disposed at a position facing the head unit 30. The head unit 30 is capable of detecting the relative position of the head support 31 and the board 8 and the relative position of the head support 31 and the feeder 28 by detecting the direction by the distance sensor. In the present embodiment, a computation to calculate the distance between the head support 31 and the board 8 or the like based on the distance between the distance sensor and the board 8 or the like is performed by the head controller 210.

The camera unit 36 captures an image of the suction area 48, the electronic component suctioned by the nozzle 32, the electronic component 44 to be suctioned by the nozzle 32, the electronic component 44 mounted on the board 8, and the like to detect the condition of the electronic component 44. The condition of the electronic component 44 is whether the electronic component 44 is suctioned by the nozzle 32 in a correct posture, whether the electronic component 44 to be suctioned by the nozzle 32 is disposed at a given position of the feeder 28, whether the electronic component 44 suctioned by the nozzle 32 is mounted on a given position on the board 8, and the like. The camera unit 36 has a bracket 50 and a plurality of camera modules 51. The bracket 50 is, as shown in FIG. 2, coupled to the lower side of the head support 31, on the side of the board 8 and the feeder 28. The bracket 50 supports the camera modules 51. The camera modules 51 are fixed to their respective positions inside the bracket 50. Each camera module 51 has a camera 52, a first illuminator 54, a second illuminator 56 and a baffle 58. The camera modules 51 are disposed, as shown in FIG. 3, one for one nozzle 32. That is, in the present embodiment, six camera modules 51 are disposed for six nozzles 32. The camera modules 51 capture images of the electronic components 44 suctioned by the corresponding nozzles 32.

The laser recognition device 38 is supported by the bracket 50. Specifically, the laser recognition device 38 is incorporated on the lower side of the area where the camera modules 51 are arranged in the bracket 50. The laser recognition device 38 is a device that detects the shape of the electronic component 44 by radiating laser light to the electronic component 44 suctioned by the nozzle 32 of the head unit 30. When the laser recognition device 38 detects the shape in one direction of the electronic component 44 suctioned by the nozzle 32, the laser recognition device 38 moves or rotates the nozzle 32 by the nozzle driver 34 to move or rotate the electronic component 44, and detects the shape in another direction. By thus detecting shapes in a plurality of directions, the laser recognition device 38 can accurately detect the three-dimensional shape of the electronic component 44.

Figure 4:
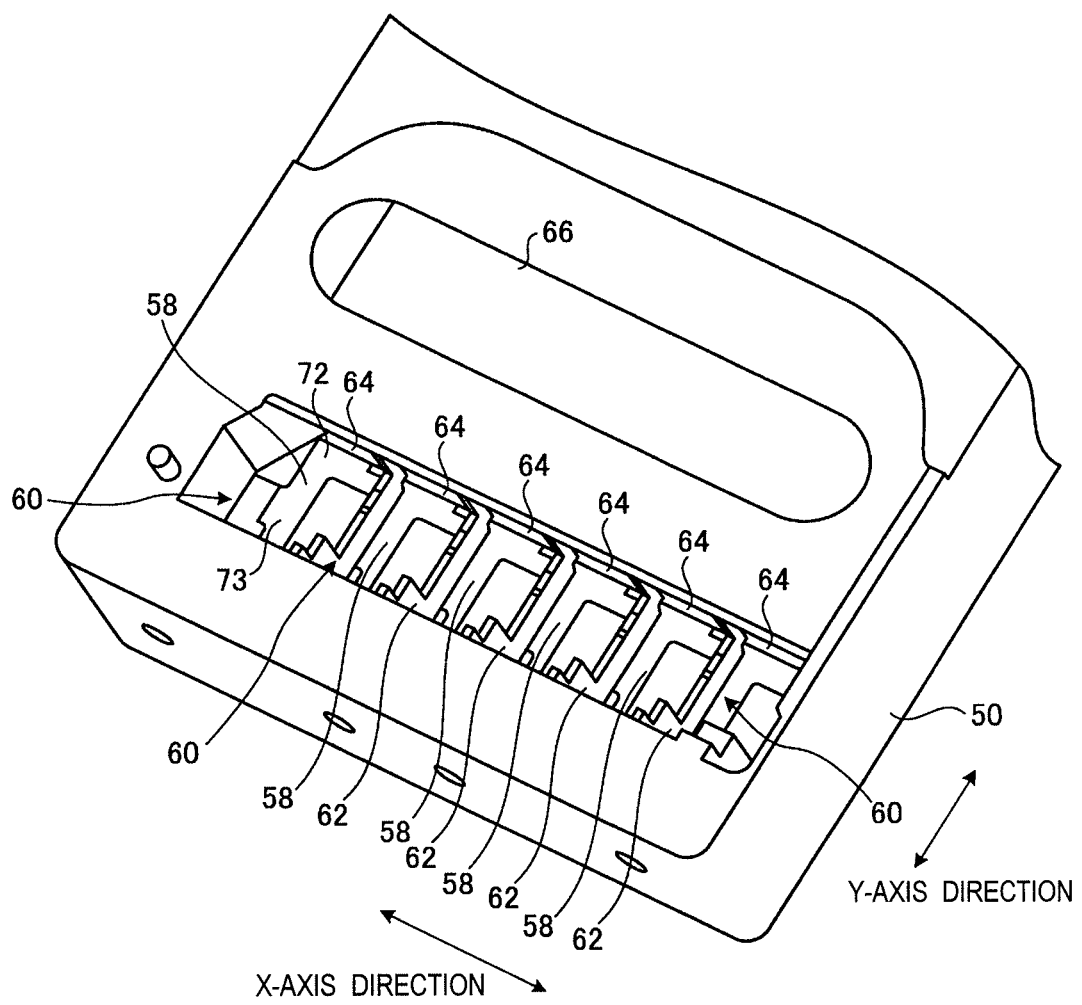
FIG. 4 is a schematic view illustrating a schematic structure of a bracket of the camera unit.
Figure 5:
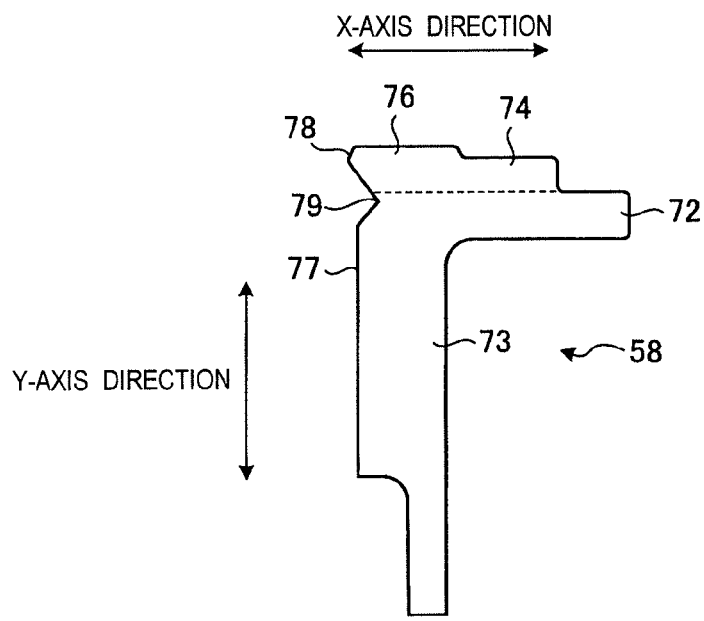
FIG. 5 is a front view illustrating the shape of a baffle.
Figure 6:
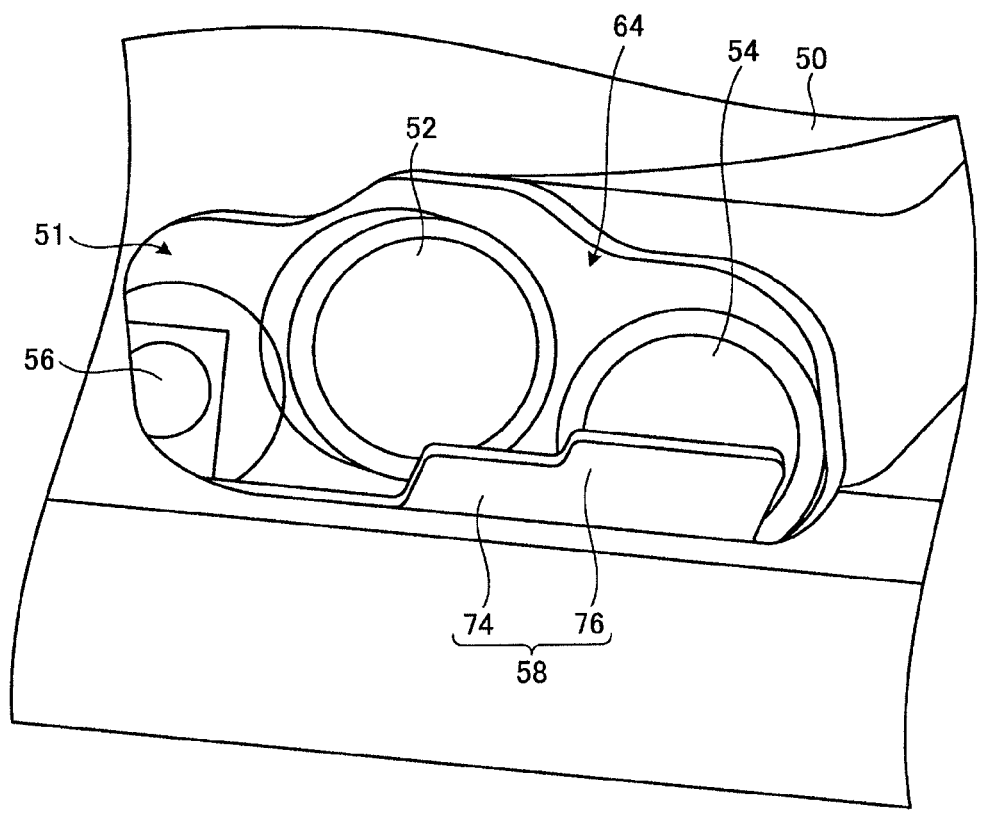
FIG. 6 is a view illustrating a condition of an opening of the bracket when viewed from the outside.

Next, members of the camera unit 36 will be described by using FIG. 4 to FIG. 6 in addition of FIG. 2 and FIG. 3. FIG. 4 is a schematic view illustrating the schematic structure of the bracket of the camera unit. FIG. 5 is a front view illustrating the shape of the baffle. FIG. 6 is a view illustrating a condition of the opening of the bracket when viewed from the outside.

The camera unit 36 has the bracket 50 and the six camera modules 51. The bracket 50 is, as shown in FIG. 2 to FIG. 4, a member coupled to the bottom surface of the head support 31. In the bracket 50, as shown in FIG. 4, six camera module holding area 60 that support the six camera modules 51, respectively, and a nozzle opening 66 as a passage of the six nozzles 32 are formed. The six camera module holding areas 60 are arranged in a row in the X-axis direction, and partition plates 62 are disposed at the boundaries of the adjoining camera module holding areas 60. That is, the camera module holding areas 60 are divided into the individual areas by the partition plates 62. Moreover, the camera module holding areas 60 each have an opening 64 formed on, of the two surfaces orthogonal to the Y-axis direction, the surface on the side of the nozzle 32. That is, in each camera module holding area 60, the surface on the side of the nozzle 32 is exposed by the opening 64 being formed. The nozzle opening 66 is an opening formed in an area where the nozzles 32 of the bracket 50 pass. The nozzle opening 66 is one opening, and the six nozzles 32 are disposed in the formed space. The bracket 50 is also a support that supports the laser recognition device 38. Moreover, the bracket 50 may be formed of one member, or may be formed by coupling a plurality of members.

Next, the camera modules 51 will be described. The six camera modules 51 are different only in the nozzles disposed in correspondence therewith, and are similar in the other structures. Therefore, in the following, one camera module 51 will be described as a representative. The camera module 51 has the camera 52, the first illuminator 54, the second illuminator 56 and the baffle 58. The camera 52 is an imager that captures an image of the electronic component 44 suctioned by the nozzle 32 or the electronic component 44 to be suctioned by the nozzle 32. In the camera 52, light receiving elements such as CCD image sensors (charge coupled device image sensors) or CMOS image sensors (complementary metal oxide semiconductor image sensors) are two-dimensionally arranged, and light receiving signals are received by the light receiving elements, thereby acquiring an image. The first illuminator 54 and the second illuminator 56 are light emitting elements, each configured to radiate light toward the area where the image is captured by the camera 52. As the light emitting elements, LEDs (light emitting diodes) or semiconductor lasers may be used. The baffle 58 is a plate-like member that intercepts part of the light radiated from the first illuminator 54 and intercepts part of the light radiated from the first illuminator 54 and the second illuminator 56 and then, reflected to be incident on the camera 52.

Next, the arrangement relationship between members of the camera module 51 will be described. The camera module 51 is disposed, as shown in FIG. 2, on the Y-Z plane, diagonally above the point of intersection with the line connecting the surface where the electronic component 44 is placed and the movement locus of the nozzle 32, that is, the position where the electronic component 44 to be suctioned by the nozzle 32 is suctioned or mounted on the board 8 (hereinafter, referred to as "suction and mounting operation position"). While only the camera 52 is shown in FIG. 2, the first illuminator 54 and the second illuminator 56 are similarly disposed diagonally above the suction and mounting operation position.

In the camera module 51, as shown in FIG. 3, on the X-Y plane, the camera 52, the first illuminator 54 and the second illuminator 56 are arranged in a row in the X-axis direction. That is, the nozzles 32 are aligned parallel to the arrangement direction. Moreover, in the camera module 51, the first illuminator 54 and the second illuminator 56 are disposed on both side surfaces of the camera 52. Moreover, in the camera module 51, the first illuminator 54 and the nozzle 32 are disposed at the same position at a position in the X-axis direction, that is, at an X-axis coordinate. Consequently, the line connecting the first illuminator 54 and the nozzle 32 is parallel to the Y-axis direction. Thus, the first illuminator 54 is disposed on a plane passing the nozzle 32 and orthogonal to the arrangement direction. Next, the camera 52 is disposed adjacent to an end portion of the first illuminator 54 in the X-axis direction. Thus, the line connecting the camera 52 and the nozzle 32 is inclined by a given angle with respect to the Y-axis direction. Next, the second illuminator 56 is disposed adjacent to an end portion in the X-axis direction on the side not adjoining the first illuminator 54 of the camera 52. Thus, the line connecting the second illuminator 56 and the nozzle 32 is inclined by a given angle with respect to the Y-axis direction. Moreover, the angle between the line connecting the second illuminator 56 and the nozzle 32, and the Y-axis direction is an angle larger than the angle between the line connecting the camera 52 and the nozzle 32, and the Y-axis direction. Thus, in the camera module 51, on the X-Y plane, the first illuminator 54 is disposed at a position closer to the nozzle 32 than the camera 52, and the camera 52 is disposed at a position closer to the nozzle 32 than the second illuminator 56.

In the camera module 51, as shown in FIG. 3, on the X-Y plane, the baffle 58 is disposed on a side closer to the nozzle 32 than the camera 52, the first illuminator 54 and the second illuminator 56. Moreover, in the camera module 51, the baffle 58 is disposed below the camera 52, the first illuminator 54 and the second illuminator 56.

Next, the configuration of the baffle 58 will be described by using FIG. 3 to FIG. 5, particularly, FIG. 5. The baffle 58 has an L-shaped plate-like form having a first surface 72 extending in the direction of arrangement of the camera 52, the first illuminator 54 and the second illuminator 56 (that is, the X-axis direction) and a second surface 73 coupled to the end portion of the first illuminator 54 of the first surface 72 and extending in a downward direction in FIG. 5 corresponding to the Y-axis direction which is a direction orthogonal to the direction of extension of the first surface 72 and a direction away from the nozzle 32. On the first surface 72 of the baffle 58, a first exposed portion 74 and a second exposed portion 76 protruding toward the nozzle 32 more than the other surface are formed on a part of the end portion on the side of the nozzle 32. Here, the first exposed portion 74 is formed in the vicinity of the central part of the first surface 72 in the X-axis direction. Moreover, the second exposed portion 76 is formed at an end portion of the first surface 72 on the side of the first illuminator 54 in the X-axis direction. Moreover, the second exposed portion 76 connects with the first exposed portion 74, and protrudes toward the nozzle 32 more than the first exposed portion 74. Thereby, the first surface 72 has a configuration in which the shape of the end portion on the side of the nozzle 32 is such that the amount of protrusion increases from the side of the second illuminator 56 toward the first illuminator 54. Moreover, on the baffle 58, a protrusion 78 is formed in which the nozzle 32 side end portion, on the side of the first illuminator 54, of the first surface 72 protrudes toward the first illuminator 54 more than an end side 77, on the side of the first illuminator 54, of the second surface 73. Further, on the baffle 58, a concave portion 79 that is concave toward the second illuminator 56 is formed in the vicinity of the end portion, on the side of the nozzle 32, of the second surface 73 situated on the right side in FIG. 5. Here, on the baffle 58, as shown in FIG. 4, the end side 77 of the second surface 73 is abutted on the partition plate 62 of the bracket 50. Moreover, on the baffle 58, the concave portion 79 is in contact with the end portion, on the side of the nozzle 32, of the partition plate 62. The baffle 58 is supported at a given position in the camera module holding area 60 by abutting the end side 77 on the partition plate 62 and bringing the concave portion 79 into contact with the end portion, on the side of the nozzle 32, of the partition plate 62.

The camera module 51 is in the arrangement relationship as described above, and as shown in FIG. 6, the part of the camera 52 that obtains an image and the part of the first illuminator 54 and the second illuminator 56 that radiates light are disposed so as to be exposed toward the opening 64 of the bracket 50. Moreover, in the camera module 51, the first exposed portion 74 and the second exposed portion 76 formed at the end portion, on the side of the nozzle 32, of the first surface 72 of the baffle 58 are exposed out of the opening 64. Moreover, as shown in FIG. 6, the first exposed portion 74 is exposed out of the first exposed portion 74 in the vicinity of the camera 52. The second exposed portion 76 is exposed out of the opening 64 in the vicinity of the first illuminator 54.

Figure 7:
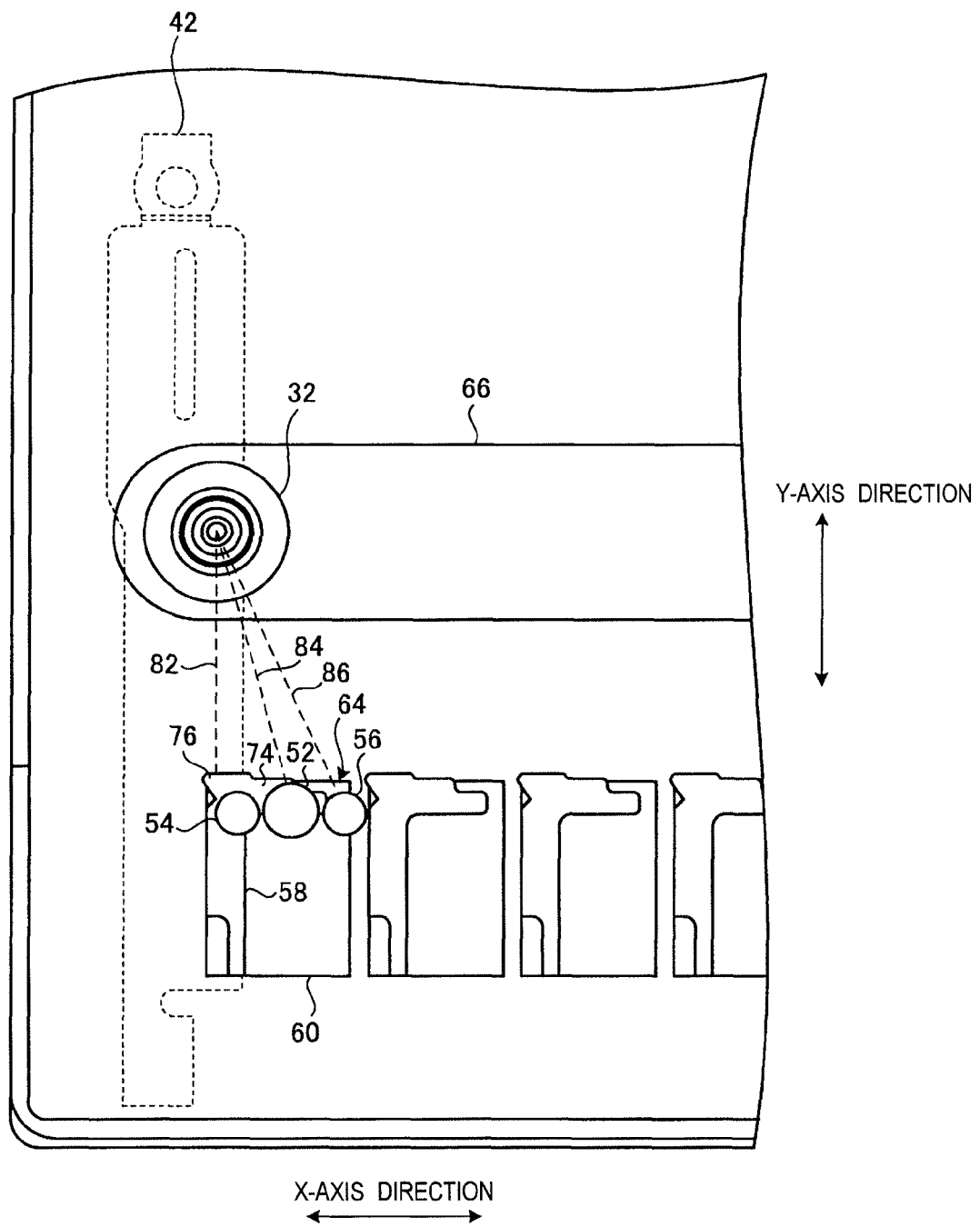
FIG. 7 is a diagram illustrating the relationship among a camera module, the nozzle and a feeder.
Figure 8:
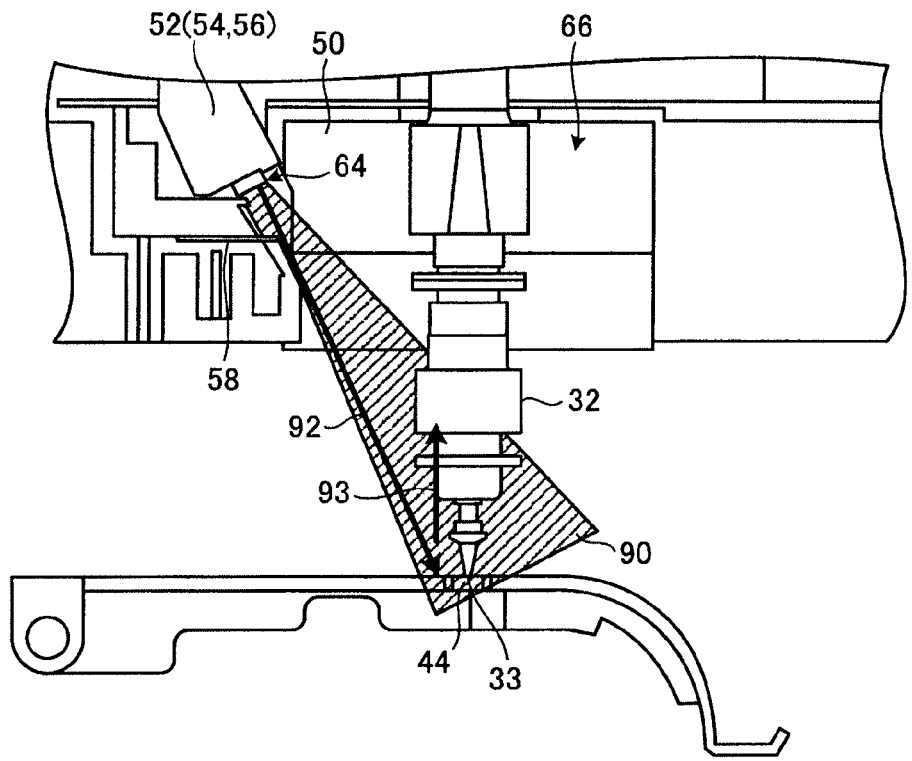
FIG. 8 is a diagram illustrating the relationship between light radiated from a first illuminator and reflected light.
Figure 9:
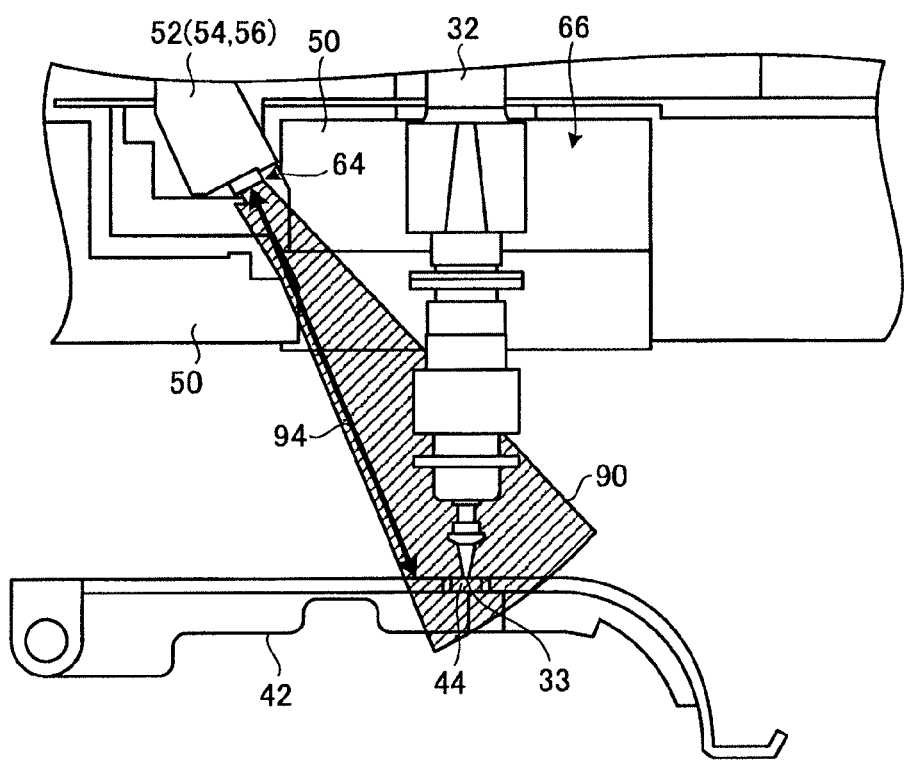
FIG. 9 is a diagram illustrating the relationship between the light radiated from the first illuminator and the reflected light when no baffle is provided.

Next, the function of the baffle 58 will be described by using FIG. 7 to FIG. 9. Here, FIG. 7 is a schematic view illustrating the correspondence relationship among the camera module, the nozzle and the feeder, FIG. 8 is a schematic view illustrating the relationship between the light radiated from the first illuminator and the reflected light, and FIG. 9 is a schematic view illustrating the relationship between the light radiated from the first illuminator and the reflected light when no baffle is provided.

The camera module 51 is in the positional relationship as described above, and as shown in FIG. 7, at the first illuminator 54 and on the X-Y plane, the second exposed portion 76 of the baffle 58 overlaps on the path of a straight line 82 connecting the suction and mounting operation position corresponding to the position of the nozzle 32, and the first exposed portion 74 of the baffle 58 overlaps on the path of a straight line 84 connecting the camera 52 and the suction and mounting operation position. Moreover, in the camera module 51, the baffle 58 is not exposed on the path of a straight line 86 connecting the second illuminator 56 and the suction and mounting operation position. That is, the part of the baffle 58 in the vicinity of the path of the straight line 86 is not exposed out of the opening 64. Thereby, as shown in FIG. 8, the radiated light, in the area closer to the vertical direction, of a radiated light 90 radiated from the first illuminator 54 is intercepted by the baffle 58. Thereby, the radiated light, the closest to the vertical direction, of the radiated light 90 irradiated from the first illuminator 54 and reaching the suction and mounting operation position is the radiated light of the arrow 92. The illumination light of the arrow 92 is reflected at the upper cover 42 to become the illumination light of the arrow 93 reflected toward the nozzle 32. On the other hand, when the baffle 58 is not provided, the radiated light, on the side closer to the vertical direction, of the radiated light 90 radiated from the first illuminator 54 is not intercepted. Accordingly, as shown in FIG. 9, the illumination light, the closest to the vertical direction, of the radiated light 90 radiated from the first illuminator 54 and reaching the suction and mounting operation position becomes the radiated light of the position of the arrow 94. Thus, by providing the baffle 58, the radiated light 90 can be restrained from being radiated to part, closer to the camera 52, of the upper cover 42 and the electronic component 44 at the suction and mounting operation position. Thereby, the radiated light of the arrow 94 can be restrained from being reflected at the upper cover 42 to be incident on the camera 52 as shown in FIG. 9.

In the camera unit 36, by providing the baffle 58 in the camera module 51 and intercepting at the second illuminator 56 the radiated light 90, on the side closer to the vertical direction, of the radiated light 90 radiated from the first illuminator 54 and reaching the suction and mounting operation position, the reflected light of the radiated light 90 can be restrained from being incident on the camera 52, and the reflected light can be restrained from being taken in the image captured by the camera 52. Thereby, a whiteout or the like can be prevented from being generated in the image captured by the camera 52, so that a high quality image can be captured. As described above, in the electronic component mounting apparatus 10, since a high quality image can be captured by the camera 52, a high quality image is obtained in which the tip of the nozzle 32, the electronic component 44 suctioned by the nozzle 32, the electronic component 44 placed on the feeder 28 and the electronic component 44 mounted on the board 8 are imaged. Consequently, in the electronic component mounting apparatus 10, the electronic component 44 to be conveyed can be appropriately checked, so that the electronic component 44 can be efficiently mounted with high accuracy.

Moreover, in the camera unit 36, the first illuminator 54 of the baffle 58 intercepts the part, on the side closer to the vertical direction, of the camera 52 so as to be narrower than the opening 64, whereby at least part of the light radiated from the first illuminator 54 and the second illuminator 56 and then, reflected to be incident on the camera 52, specifically, part of the light incident on the camera 52 from the side, closer to the vertical direction, of the camera 52 is intercepted. Thus, in the camera unit 36, the reflected light from other than the area where the object to be imaged can be restrained from reaching the camera 52. Thereby, a whiteout or the like can be prevented from being generated in the image captured by the camera 52, so that a high quality image can be captured.

Moreover, in the camera unit 36, by disposing the baffle 58 that intercepts light vertically below the camera 52, the radiated light 90 radiated toward the part vertically below the area where the image is captured by the camera 52 and the reflected light reflected at the part that is vertically below can be intercepted. Thereby, the baffle 58 can selectively intercept, of the light radiated from the first illuminator 54 and the second illuminator 56 and reflected at the upper cover 42 of the feeder 28 and the board 8, the light that is apt to reach the camera 52. Thereby, a whiteout or the like can be prevented from being generated in the image captured by the camera 52, so that a high quality image can be captured. Moreover, by selectively intercepting the light by the baffle 58, the suction and mounting operation position can be suitably illuminated, so that the brightness of the captured image can be maintained.

Moreover, in the camera unit 36, by exposing the second exposed portion 76 of the baffle 58 more than the first exposed portion 74, the radiated light 90 radiated from the first illuminator 54 can be more suitably intercepted, and the baffle 58 can be prevented from being partly situated in the area where the image is captured by the camera 52. Moreover, in the electronic component mounting apparatus 10, by not intercepting by the baffle 58 the radiated light 90 radiated from the second illuminator 56, that is, by not disposing the baffle 58 in the area where the radiated light 90 radiated from the second illuminator 56 passes, the suction and mounting operation position can be illuminated with the radiated light 90 the reflected light of which does not readily reach the camera 52. Thereby, a high quality image can be captured by the camera 52.

Moreover, in the camera unit 36, by providing the protrusion 78 protruding toward the first illuminator 54 more than the end side 77 of the second surface 73 at the end portion of the first surface 72 of the baffle 58 on the side of the first illuminator 54 and the end portion of the second surface 73 on the side of the nozzle 32, a gap can be prevented from being formed between the baffle 58 and the camera module holding area 60, thereby preventing light from leaking toward the first illuminator 54 side of the second exposed portion 76 at the opening 64.

Moreover, in the camera module 51, the camera 52 is disposed at a position diagonally above the suction and mounting operation position and inclined a predetermined angle to the Y-axis direction on the Y-Z plane. Thereby, the electronic component 44 situated at the suction and mounting operation position can be obliquely imaged from any of the X-, Y- and Z-axis directions, the three-dimensional shape of the electronic component 44 can be more excellently determined, and the rotation angle of the electronic component 44 in the horizontal direction with respect to the vertical axis and the inclination angle of the electronic component 44 in the vertical direction can be more easily recognized.

Moreover, in the camera unit 36, by disposing an illuminator on each side surface of the camera 52, a shadow is prevented from being cast on the image capturing area, so that a high quality image can be captured. Moreover, in the electronic component mounting apparatus 10, by intercepting by the baffle 58 the radiated light 90 radiated from, of the two illuminators, the first illuminator 54 closer to the suction and mounting operation position of the nozzle 32, the radiated light 90 of the illuminator the reflected light of the radiated light 90 of which more readily reaches the camera 52 can be selectively intercepted.

Because the various advantages described above can be obtained, it is advantageous that the baffle 58 of the camera unit 36 has the shape shown in FIG. 5, but it is not limited thereto. For example, the baffle may have a shape in which the amount of exposure of the exposed portion out of the opening 64 is the same between the area corresponding to the camera 52 and the area corresponding to the first illuminator 54. In this case, although there is a possibility that the amount of light incident on the camera 52 is reduced to make the image dark, effects similar to those mentioned above can be obtained. Moreover, the baffle may have a shape in which the portion exposed out of the opening is provided only in the area corresponding to the first illuminator 54. In this case, by intercepting the radiated light, on the side closer to the vertical direction, of the radiated light 90 radiated from the first illuminator 54 and reaching the suction and mounting operation position, the reflected light of the radiated light 90 can be restrained from being incident on the camera 52, so that a high quality image can be captured. The baffle may have a shape in which the amount of exposure of the exposed portion out of the opening 64 is the same between the area corresponding to the camera 52 and the area corresponding to the first illuminator 54. In this case, although there is a possibility that the amount of light incident on the camera 52 is reduced to make the image dark, effects similar to those mentioned above can be obtained. The baffle may have a shape in which the portion exposed out of the opening 64 is provided only in the area corresponding to the first illuminator 54. In this case, by intercepting the radiated light 90, on the side closer to the vertical direction, of the radiated light 90 radiated from the first illuminator 54 and reaching the suction and mounting operation position, the reflected light of the radiated light 90 can be restrained from being incident on the camera 52, so that a high quality image can be captured. The baffle may have a shape in which an exposed portion ranging from an end portion of the first illuminator 54 to an end portion of the second illuminator 56 is provided and a partial area on the vertical direction side of the first illuminator 54, the camera 52 and the second illuminator 56 is closed. In this case, although there is a possibility that the amount of light incident on the camera 52 is reduced by the baffle to make the image dark, effects similar to those mentioned above can be obtained.

The shape of the baffle is not limited to the embodiment described above, either, and may have any shape as long as a vertical direction side area of at least one of the first illuminator 54 and the camera 52 is closed. For example, the baffle is not limited to an L-shaped one, and may have an elongate plate-like shape where the arrangement direction of the first illuminator 54, the camera 52 and the second illuminator 56 is the direction of the length. Moreover, it is advantageous that the baffle has a shape in which the amount by which a vertical direction side area of at least one of the first illuminator 54 and the camera 52 is closed is larger than the amount by which a vertical direction side area of the second illuminator 56 is closed. Thereby, the incidence of the reflected light on the camera 52 can be restrained while suppressing the reduction of the amount of light reaching the suction and mounting operation position, so that a high quality image can be captured.

In the embodiment described above, the line connecting the first illuminator 54 and the nozzle 32 is parallel to the Y-axis direction to capture a more suitable image. However, this is not necessarily required, in so far as the camera module 51 is configured such that the first illuminator 54 is disposed at a position closer to the nozzle 32 than the camera 52.

Moreover, in the embodiment described above, the baffle 58 is separately provided for each camera module 51, but this is not necessarily required. The electronic component mounting apparatus 10 and the camera unit 36 may be configured such that a plurality of baffles are molded integrally to provide one piece of baffle for a plurality of camera modules 51. For example, the baffles 58 of the present embodiment may be connected into one baffle. By forming a plurality of baffles as one piece-structure, the number of components can be reduced, and the displacement of the relative positions of the baffles can be suppressed among camera modules.

It is also advantageous that the camera unit 36 is provided with a movement mechanism that moves the baffle 58. That is, it is also advantageous to provide a movement mechanism that adjusts the position of the baffle 58 according to the intended use or the like and adjusts the amount of exposure out of the opening 64, that is, the amount of radiated light 90 and reflected light intercepted by the baffle 58. As the movement mechanism of the baffle 58, a rack-and-pinion mechanism or a mechanism that moves the baffle 58 in one direction by a linear motor may be used. In the electronic component mounting apparatus 10, by making the position of the baffle 58 adjustable, under use conditions where the quality of the image is not degraded, the amount of exposure of the baffle 58 is reduced and the object to be imaged can be imaged with much light, and under use conditions where there is a possibility that a whiteout or the like occurs, the amount of exposure of the baffle 58 is increased and the object to be imaged can be imaged while the arrival of the reflected light at the camera 52 is restrained. Thereby, the image can be taken under a condition more suitable for the use condition, so that a higher quality image can be captured.

Next, returning to FIG. 2, the control structure of the electronic component mounting apparatus 10 will be described. The electronic component mounting apparatus 10 has, as shown in FIG. 2, the head controller 210, the controller 212, the imaging controller 220 and the component supply controller 222. These controllers are each formed of a member having a computation function and a storage function such as a CPU, a ROM or a RAM. Moreover, while a plurality of controllers are present for convenience of explanation in the present embodiment, they may be one controller. Moreover, when the control function of the electronic component mounting apparatus 10 is one controller, it may be implemented as one arithmetic unit or may be implemented as a plurality of arithmetic units.

The head controller 210 is connected to the nozzle driver 34, various sensors disposed on the head support 31, and the controller 212, controls the nozzle driver 34, and controls the operation of the nozzles 32. The head controller 210 controls the electronic component suction/release operation of the nozzles 32 and the rotation and Z-axis direction movement of the nozzles 32 based on the operation instruction supplied from the controller 212 and the detection results of the various sensors (for example, the distance sensor).

The controller 212 is connected to members of the electronic component mounting apparatus 10, and executes stored programs and controls the operations of the members based on the inputted operation signals and the information detected by the members of the electronic component mounting apparatus 10. The controller 212 controls, for example, the conveyance of the board 8, the driving of the head 15 by the XY movement mechanism 16, the image taking conditions of the camera unit 36, and the like. Moreover, the controller 212 transmits various instructions to the head controller 210 as mentioned above, and controls the control operation by the head controller 210 as well. The controller 212 also controls the control operations by the imaging controller 220 and the component supply controller 222.

The controller 212 obtains various pieces of information necessary for the image taking by the camera 52 from the obtained various pieces of information, and determines the image taking conditions of the camera 52. The image taking conditions are conditions such as image taking timing, specifically, the position of the nozzle 32 to be imaged and the exposure and magnification of the camera 52. The controller 212 transmits the determined image taking conditions to the imaging controller 220. Moreover, the controller 212 analyzes the image data obtained by the camera 52 and transmitted from the imaging controller 220. The controller 212 also controls the operations of the first illuminator 54 and the second illuminator 56. Specifically, the controller 212 controls the voltage value and the current value supplied to the first illuminator 54 and the second illuminator 56, and controls the amount of radiated light radiated from the first illuminator 54 and the second illuminator 56 and whether to cause them to emit light or not. For the controller 212, a controller that controls the operation of the camera unit 36 may be separately provided.

The imaging controller 220 controls the image taking operation of the camera 52, and obtains the data of the image captured by the camera 52. The imaging controller 220 determines the image taking conditions based on the instruction transmitted from the controller 212, and controls the camera 52 under the determined image taking conditions to obtain an image. The imaging controller 220 obtains the encoder signal of the Z-axis direction driving mechanism of the nozzle driver 34 that drives the nozzle 32 to be imaged, through the controller 212, whereby the information on the position of the nozzle 32 in the Z-axis direction can be obtained. When the imaging controller 220 detects that the position of the nozzle 32 obtained based on the encoder signal is a given position determined by the controller 212, the imaging controller 220 captures and obtains an image. The imaging controller 220 transmits the data of the captured image to the controller 212.

The component supply controller 222 controls the supply of the electronic components 44 by the component supply device 14. The component supply controller 222 controls the electronic component accommodating tape drawing operation (moving operation) by the draw-out mechanism 46 of the draw-out mechanism 46 of the feeder 28. The component supply controller 222 causes the electronic component accommodating tape 100 to be drawn out by the draw-out mechanism 46 based on the instruction from the controller 212. The component supply controller 222 adjusts the movement amount of the electronic component accommodating tape 100 by adjusting the amount of drawing of the electronic component accommodating tape 100 by the draw-out mechanism 46. Thereby, the component supply controller 222 exposes a given position of the electronic component accommodating tape 100 to the suction area 48.

Figure 10:
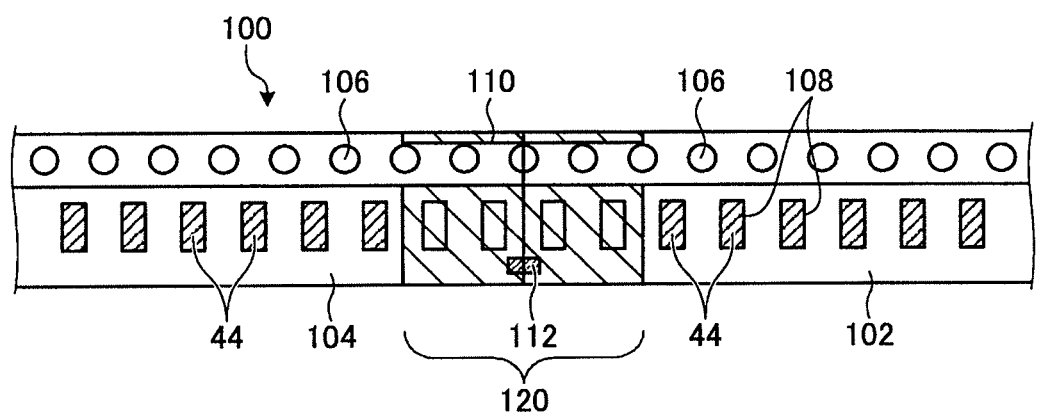
FIG. 10 is a diagram illustrating a schematic structure of a connection part of electronic component accommodating tapes.
Figure 11:
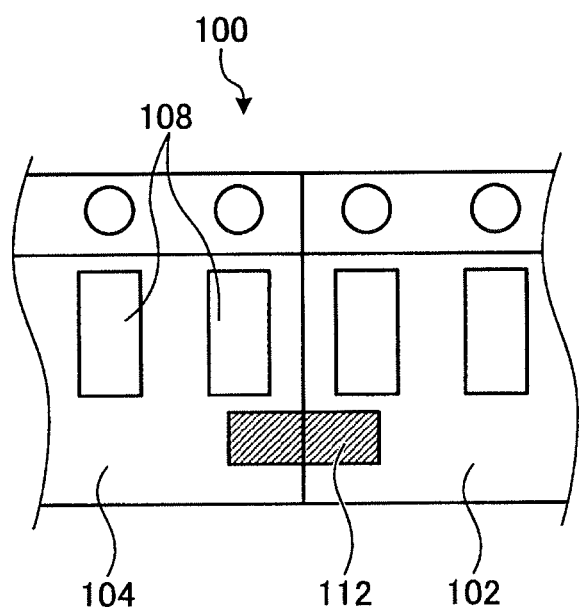
FIG. 11 is a diagram illustrating the connection part of the electronic component tapes in an enlarged manner.

Next, the electronic component accommodating tape 100 will be described by using FIG. 10 and FIG. 11. FIG. 10 is a schematic view illustrating the schematic structure of a connection part of the electronic component accommodating tapes. FIG. 11 is a schematic view illustrating the connection part of the electronic component accommodating tapes in close-up. Using FIG. 10 and FIG. 11, a part of the electronic component accommodating tape 100 is shown where two electronic component accommodating tapes are connected, that is, splicing is performed.

The electronic component accommodating tape 100 shown in FIG. 10 has a preceding electronic component accommodating tape 102 and a succeeding electronic component accommodating tape 104. The preceding electronic component accommodating tape 102 and the succeeding electronic component accommodating tape 104 are connected by a connecting member 110, and in the area of connection by the connecting member 110, a mark 112 is formed.

The preceding electronic component accommodating tape 102 and the succeeding electronic component accommodating tape 104 have a predetermined width, and have holes 106 and storage cells 108 formed at regular intervals in the extension direction. That is, in the preceding electronic component accommodating tape 102 and the succeeding electronic component accommodating tape 104, a plurality of holes 106 are formed in a row, and a plurality of storage cells 108 are formed in a row in the extension direction. The draw-out mechanism 46 moves the electronic component accommodating tape 100 by inserting movable elements into the holes 106 formed in the electronic component accommodating tape 100, that is, hooking the holes 106 on the movable elements and moving the movable elements.

In the storage cells 108 which are concave portions of a predetermined size, the electronic components 44 are stored basically in a state of being detachably attachable. The electronic components 44 stored in the storage cells 108 are moved from the storage cells 108 by being suctioned by the nozzles 32 and conveyed at the time of the component suction and mounting operation by the electronic component mounting apparatus 10. The storage cells 108 from which the electronic components 44 have been conveyed by the nozzles 32 are empty. Moreover, in a given number of storage cells 108 at an end portion of the preceding electronic component accommodating tape 102 and an end portion of the succeeding electronic component accommodating tape 104, that is, the storage cells 108 situated in an area 120 in FIG. 10, no electronic component is stored from the beginning.

The connecting member 110 connects the preceding electronic component accommodating tape 102 and the succeeding electronic component accommodating tape 104. The connecting member 110 is, for example, a member that connects the tapes with adhesive tape or with an adhesive chemical substance such as an adhesive agent or a member coupled to the tapes with a staple that supports the preceding electronic component accommodating tape 102 and the succeeding electronic component accommodating tape 104.

The mark 112 is a mark indicative of splicing, and as shown in FIG. 10 and FIG. 11, formed in an area including the boundary between the preceding electronic component accommodating tape 102 and the succeeding electronic component accommodating tape 104. Specifically, it has a bar shape extending in the direction of extension of the preceding electronic component accommodating tape 102 and the succeeding electronic component accommodating tape 104 with the center at the area including the boundary between the preceding electronic component accommodating tape 102 and the succeeding electronic component accommodating tape 104. The mark 112 is formed in a color different from that of the preceding electronic component accommodating tape 102 and the succeeding electronic component accommodating tape 104. As the method of forming the mark 112 on the preceding electronic component accommodating tape 102 and the succeeding electronic component accommodating tape 104, various methods may be used. For example, the mark 112 may be formed by writing it on the preceding electronic component accommodating tape 102 and the succeeding electronic component accommodating tape 104 by using stationery such as a pen or the mark 112 may be formed by bonding a bar-shaped member to the preceding electronic component accommodating tape 102 and the succeeding electronic component accommodating tape 104.

In the electronic component mounting apparatus 10, before the operation of suctioning the electronic components 44 held by the electronic component accommodating tape 100 is executed, an image of the electronic component accommodating tape 100 situated in the suction area 48 is captured by the camera unit 36. In the electronic component mounting apparatus 10, whether the part situated in the suction area 48 is the boundary between the preceding electronic component accommodating tape 102 and the succeeding electronic component accommodating tape 104, that is, whether the part is a spliced portion or not can be detected by detecting whether the mark 112 is included in the captured image or not. The operation of the electronic component mounting apparatus 10 will be described later.

The mark 112 only necessarily has a color and a size that enable discrimination from the other members included in the captured image such as the preceding electronic component accommodating tape 102, the succeeding electronic component accommodating tape 104, the electronic components 44 and the upper cover, and may have various shapes, colors and sizes.

Figure 12:
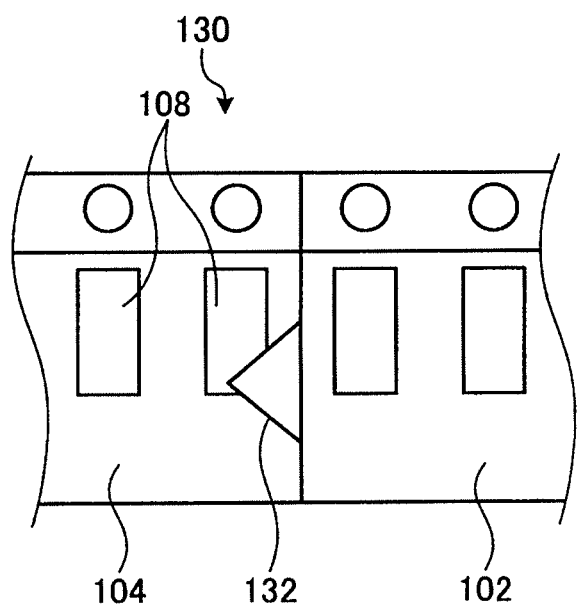
FIG. 12 is a diagram illustrating a schematic structure of another example of the connection part of the electronic component accommodating tapes.
Figure 13:
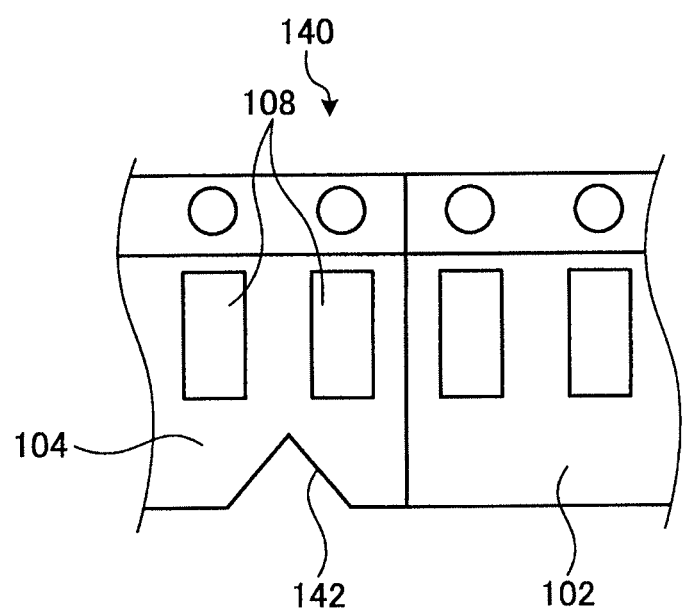
FIG. 13 is a diagram illustrating a schematic structure of another example of the connection part of the electronic component accommodating tapes.

FIG. 12 and FIG. 13 are diagrams illustrating schematic structures of other examples of the connection part of the electronic component accommodating tapes. Here, while the mark 112 is used as the mark indicative of splicing in the embodiment described above, it is not limited thereto. As the mark indicative of splicing, various marks that can be imaged by the camera unit 36 and recognized may be used. In an electronic component accommodating tape 130 shown in FIG. 12, a notch 132 is formed at an end portion of the succeeding electronic component accommodating tape 104 as the boundary between the preceding electronic component accommodating tape 102 and the succeeding electronic component accommodating tape 104. In the electronic component accommodating tape 130, the notch 132 serves as the mark indicative of splicing. Thus, as the mark indicative of splicing, a notch formed on at least one of the preceding electronic component accommodating tape 102 and the succeeding electronic component accommodating tape 104 may also be used.

Moreover, the mark indicative of splicing is only necessarily formed at a position that falls within one image when the boundary (connection part) between the two electronic component accommodating tapes is imaged, and may be formed other than at the position including the boundary (connection part) between the two electronic component accommodating tapes. That is, the mark indicative of splicing may be formed at a position not including the boundary (connection part) between the two electronic component accommodating tapes. In an electronic component accommodating tape 140 shown in FIG. 13, a notch 142 is formed on the succeeding electronic component accommodating tape 104 that is not in contact with the boundary between the preceding electronic component accommodating tape 102 and the succeeding electronic component accommodating tape 104. On the electronic component accommodating tape 140, the notch 142 serves as the mark indicative of splicing. Thus, a notch formed at a position not in contact with the boundary between the preceding electronic component accommodating tape 102 and the succeeding electronic component accommodating tape 104 may also be used as the mark indicative of splicing. While the electronic component accommodating tape 140 of FIG. 13 has a notch, the same applies to the case of a mark.

Figure 14:
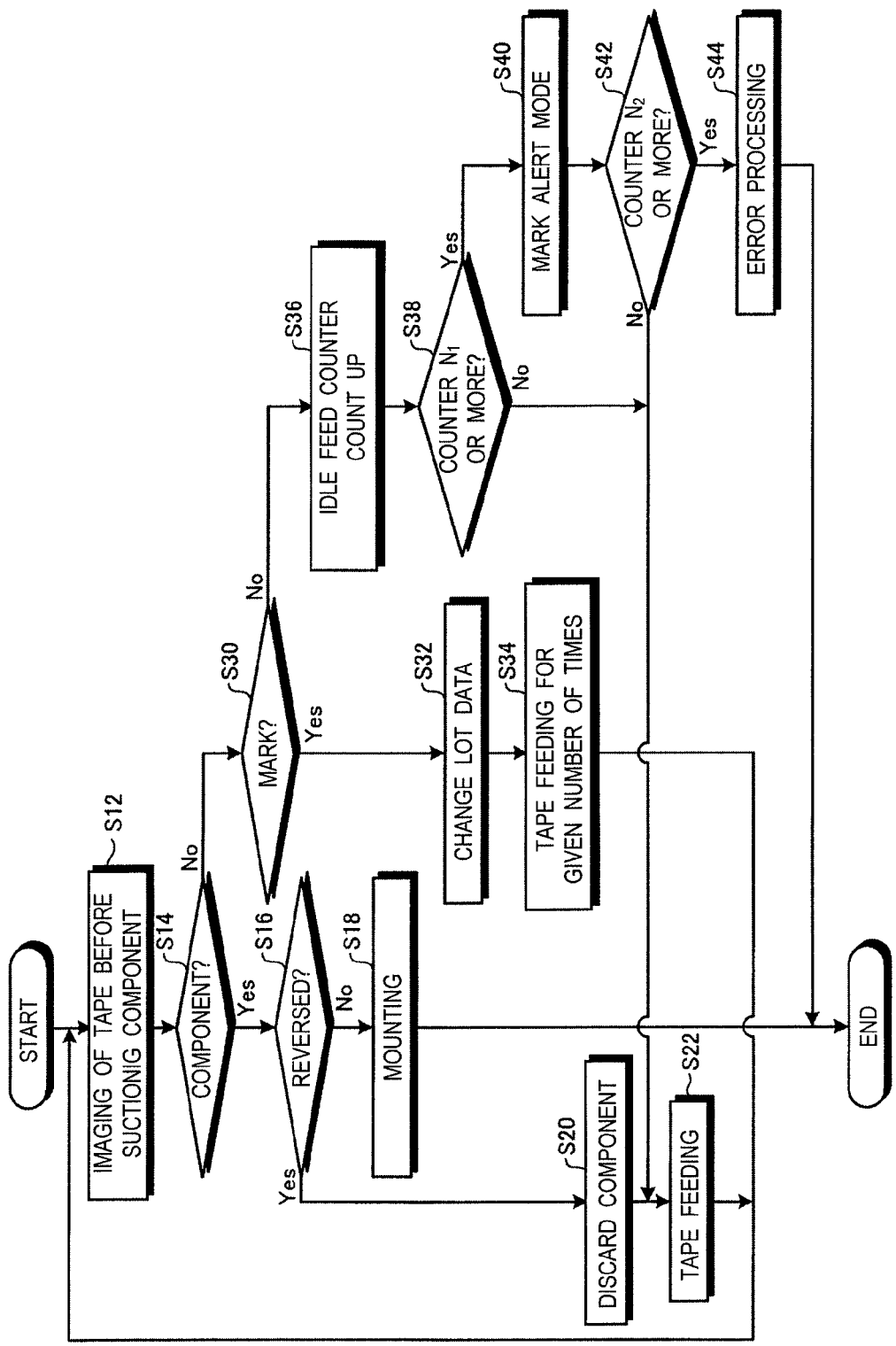
FIG. 14 is a flowchart illustrating an example of operations of the electronic component mounting apparatus.
Figure 15:
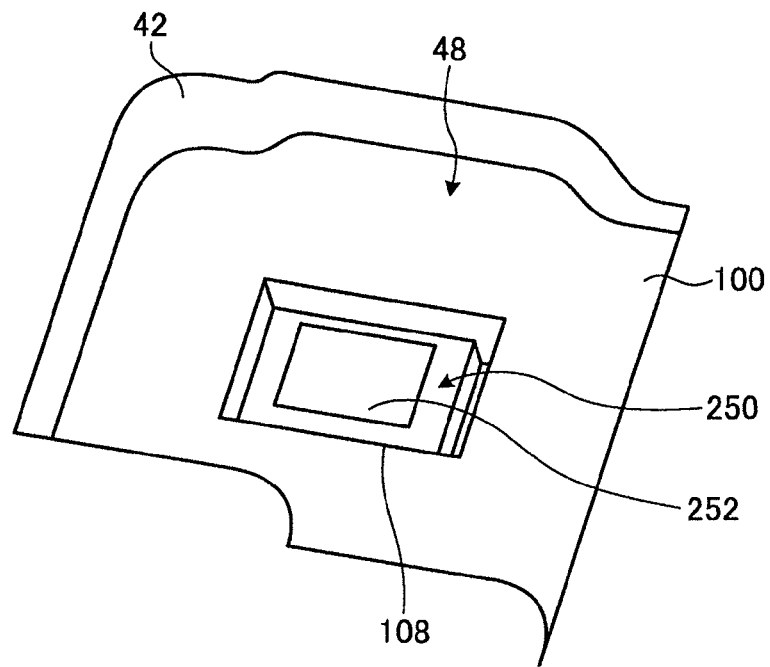
FIG. 15 is a diagram illustrating an example of an electronic component stored in a storage cell of the electronic component accommodating tape.
Figure 16:
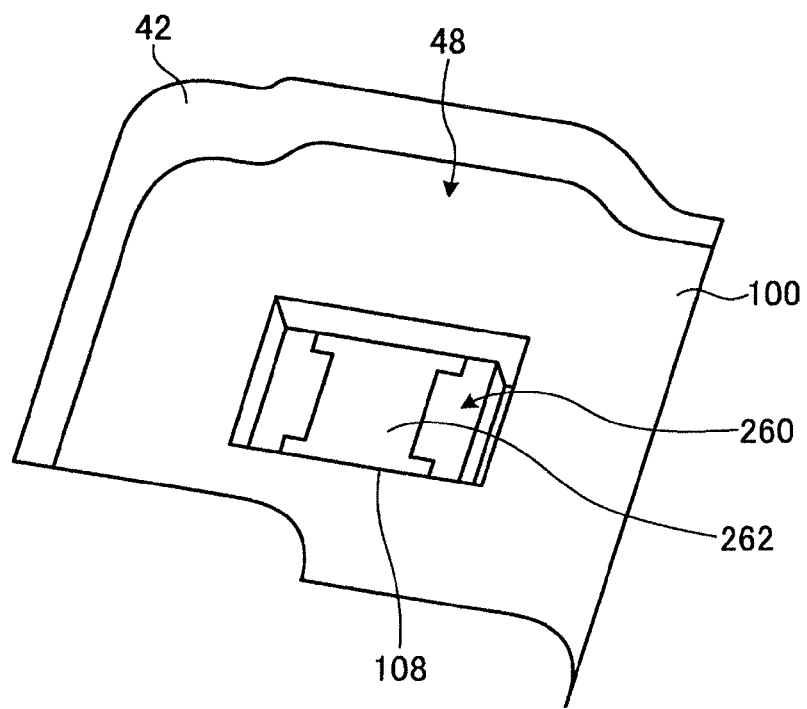
FIG. 16 is a diagram illustrating another example of an electronic component stored in a storage cell of the electronic component accommodating tape.

FIG. 14 is a flowchart showing an example of the operation of the electronic component mounting apparatus. FIG. 15 and FIG. 16 are schematic views showing an example of the electronic component stored in the storage cell of the electronic component accommodating tape. Hereinafter, the operation of the electronic component mounting apparatus 10, specifically, the operation when the head unit 30 suctions the electronic component 44 held by the component supply device 14 will be described by using FIG. 14 to FIG. 16. Here, in the electronic component mounting apparatus 10, the operation is executed before the operation is executed of moving the head unit 30 to the vicinity of the component supply device 14 and suctioning the electronic component 44 by the nozzle 32 from the storage cell 108 exposed to the suction area 48 in the component supply device 14. Moreover, the processing shown in FIG. 14 is executed by the controller 212 controlling the operations of the members.

The controller 212 moves the head unit 30 to the vicinity of the component supply device 14, moves, of the feeder 28, the suction area 48 where the electronic component accommodating tape 100 holding the electronic component 44 to be suctioned is exposed, to an image taking possible position, and then, captures an image of the tape prior to component suctioning by the camera unit 36 (step S12). That is, the controller 212 captures an image of the suction area 48 where the electronic component accommodating tape 100 is exposed.

After taking an image at step S12, the controller 212 starts the analysis of the captured image, and determines whether there is a component (step S14). Specifically, the controller 212 analyzes the captured image, and determines whether the electronic component 44 is stored in the storage cell 108 of the electronic component accommodating tape 100 situated in the suction area 48. When the controller 212 determines that there is a component (step S14; Yes), the controller 212 proceeds to step S16, and when determines that there is no component (step S14; No), it proceeds to step S30.

When the controller 212 determines that there is a component at step S14 (step S14; Yes), the controller 212 determines whether the component is reversed, that is, whether the electronic component 44 is facing up or down (step S16). Specifically, the controller 212 analyzes the captured image, and determines whether the electronic component 44 stored in the storage cell 108 is in a condition where a suctioned surface 252 is exposed like an electronic component 250 shown in FIG. 15 or in a condition where a bonding surface 262 contacting the board 8 when the component is mounted is exposed like an electronic component 260 shown in FIG. 16. In the present embodiment, the condition where the suctioned surface 252 is exposed like the electronic component 250 shown in FIG. 15, that is, the condition where the electronic component is stored in the storage cell 108 in the correct orientation is facing up, whereas the condition where the bonding surface 262 is exposed like the electronic component 260 shown in FIG. 16, that is, the condition where the electronic component is stored in the storage cell 108 in an incorrect orientation (orientation reversed from, the correct orientation) is facing down. Incorrect orientations other than the case where the electronic component is reversed may be determined as facing down and reversed.

When the controller 212 determines that the component is not reversed, that is, the electronic component 44 is facing up at step S16 (step S16; No), the controller 212 executes mounting processing (step S18). The mounting processing is processing of mounting the electronic component 44 on the board 8. Specifically, after suctioning the electronic component 44 stored in the storage cell 108 (the electronic component 44 imaged at step S12) by the nozzle 32, the controller 212 raises the nozzle 32. Thereafter, the controller 212 moves the head unit 30 so that the nozzle 32 faces the position of the board 8 where the electronic component 44 is mounted, lowers the nozzle 32, and separates the electronic component 44 from the nozzle 32, thereby mounting the electronic component 44 on the board 8. After executing the mounting processing, the controller 212 ends the present processing.

When the controller 212 determines that the component is reversed, that is, the electronic component 44 is facing down at step S16 (step S16; Yes), the controller 212 executes component discarding processing (step S20). The component discarding processing is processing of discarding the electronic component 44 that is facing down in the storage cell 108. After suctioning the electronic component 44 stored in the storage cell 108 (the electronic component 44 imaged at step S12) by the nozzle 32, the controller 212 raises the nozzle 32. Thereafter, the controller 212 moves the head unit 30 so that the nozzle 32 faces the area where the electronic component 44 to be discarded is collected, and separates the electronic component 44 from the nozzle 32, thereby discarding the electronic component 44. After executing the component discarding processing at step S20, the controller 212 executes tape forwarding processing (step S22). The tape forwarding processing is processing of moving the electronic component accommodating tape 100 by the draw-out mechanism 46 and moving by one chamber the storage cells 108 exposed to the suction area 48. The draw-out mechanism 46 moves the electronic component accommodating tape 100 so that the storage cells 108 on the side of the electronic component accommodating tape 100 not passing the suction area 48 are exposed to the suction area 48. That is, the draw-out mechanism 48 moves the electronic component accommodating tape 100 in one direction, and exposes the storage cells 108 arranged in a row to the suction area 48 in order. After executing the processing of step S22, the controller 212 proceeds to step S12.

When the determination at step S14 is No, the controller 212 determines whether the mark is present (step S30). Specifically, the controller 212 determines whether the mark 112 is included in the image captured at step S12. When the controller 212 determines that the mark is present at step S30 (step S30; Yes), the controller 212 changes the lot data (step S32). That is, when detecting the mark 112 formed at the connection part (boundary) of the two electronic component accommodating tapes, the controller 212 determines that the electronic component accommodating tape passing the suction area 48 is changed to the electronic component accommodating tape of a new lot, and changes the information on the electronic component accommodating tape associated with the electronic component 44 suctioned in the suction area 48. The lot data can be obtained by reading the information of the bar code of the electronic component accommodating tape or detecting the information inputted by the operator. As well as changing the lot data, the controller 212 may detect the position where the electronic component accommodating tape of a new lot passes the suction area 48, or the like and make fine adjustments of the operations.

After changing the lot data at step S32, the controller 212 executes a given number of times of tape forwarding processing (step S34). That is, the controller 212 moves the electronic component accommodating tape 100 by a distance corresponding to a plurality of number of times of tape forwarding processing of step S22, that is, a distance where a given number of storage cells 108 pass the suction area 48. Here, the given number is the number of previously empty storage cells 108 at an end portion of the electronic component accommodating tape. That is, the controller 212 moves the electronic component accommodating tape by a distance corresponding to the empty storage cells 108 situated at the end portion of the electronic component accommodating tape of a new lot, and exposes to the suction area 48 the storage cells 108 of the electronic component accommodating tape of the new lot where the electronic components 44 are stored. After performing step S34, the controller 212 proceeds to step S12.

When the controller 212 determines that the mark is absent at step S30 (step S30; No), as step S36, the controller 212 causes an idle feed counter to count up. The idle feed counter is a counter that counts the number of times that the storage cells 108 are continuously empty. The idle feed counter is reset every time the present processing ends.

After counting up at step S36, the controller 212 determines whether the counter is equal to or more than N1 times (step S38). N1 times are the number of previously empty storage cells 108 at the end portion of the electronic component accommodating tape or a number equal to or less than that. When the controller 212 determines that the counter is not equal to or more than N1 times, that is, it is less than N1 times at step S38 (step S38; No), the controller 212 proceeds to step S22.

When the controller 212 determines that the counter is equal to or more than N1 times at step S38 (step S38; Yes), the controller 212 sets a mark alert mode (step S40). The mark alert mode is a mode in which processing is executed with higher accuracy than when the processing of step S30 is executed. Thereby, the controller 212 can analyze in more detail the image where empty cells continue a given number of times and the mark is highly likely included. After setting the mode at step S40, the controller 212 determines whether the counter is equal to or more than N2 times (step S42). N2 times are a number larger than the number of previously empty storage cells 108 at the end portion of the electronic component accommodating tape. When the controller 212 determines that the counter is not equal to or more than N2 times, that is, it is less than N2 times at step S42 (step S42; No), the controller 212 proceeds to step S22.

When the controller 212 determines that the counter is equal to or more than N2 times at step S42 (step S42; Yes), the controller 212 executes error processing (step S44). The error processing is processing of notifying the operator that an anomaly has occurred on the target electronic component accommodating tape. After performing step S44, the controller 212 ends the present processing.

In the electronic component mounting apparatus 10, as described above, by determining whether the part exposed to the suction area 48 is a spliced portion by the camera unit 36 integrally provided in the head unit 30, whether the electronic component accommodating tape is changed can be suitably determined. In the electronic component mounting apparatus 10, by taking an image of the suction area 48 used for the determination as to whether the part is a spliced portion by the camera unit 36 integrally provided in the head unit 30, the electronic component accommodating tape can be imaged at close range, so that a detailed image can be obtained. Moreover, since the function of detecting whether the part is a spliced portion can be implemented by the function of the camera unit 36 used also for other various purposes, the apparatus structure can be simplified. Specifically, since it is unnecessary to provide a sensor used only for detecting the connection part of the electronic component accommodating tapes or a specialized apparatus or mechanism other than the control program, increase in the number of components and increase in the size of the apparatus can be prevented. Thereby, in the electronic component mounting apparatus 10, the connection part of an electronic component accommodating tapes can be appropriately detected, so that electronic components can be efficiently mounted with high accuracy.

Moreover, in the electronic component mounting apparatus 10, the processing can be prevented from proceeding without the nozzle 32 suctioning the electronic component 44 by repeating the following: Whether the electronic component 44 is present in the storage cell 108 is determined, and when the storage cell 108 is empty, an instruction to forward the electronic component accommodating tape 100 is output to forward the tape, and whether the electronic component 44 is present in the storage cell 108 is determined again. Moreover, by determining whether the electronic component 44 is present based on an image as in the present embodiment, only capturing and analyzing the image and forwarding the electronic component accommodating tape is required, and it is unnecessary to perform the suction operation by the nozzles, so that wasteful operations of the head unit 30 can be omitted.

Moreover, in the electronic component mounting apparatus 10, by determining whether the part is a spliced portion or not based on the captured image, even when the spliced portion of the electronic component accommodating tape is in the suction area, for example, at power-on, the spliced portion can be detected.

Moreover, in the electronic component mounting apparatus 10, by determining whether the part is a spliced portion based on whether the mark indicative of splicing is present in the image, the determination can be made by using the mark present in the spliced portion, so that the spliced portion can be determined with higher accuracy. Accordingly, detection failure of the spliced portion can be suppressed. While it is advantageous to determine whether the part is a spliced portion based on whether the mark indicative of splicing is present in the image in terms of high detection accuracy, the electronic component mounting apparatus 10 is not limited thereto. In so far as the electronic component mounting apparatus 10 determines whether the part is a spliced portion based on the image of the suction area captured by the camera unit 36, and the determination may be made based on, for example, the presence or absence of the boundary or the presence or absence of a connection member.

Here, as described above, at the end portion which is the connection part of the electronic component accommodating tapes, a given number of storage cells are empty. Thus, basically, the condition where the storage cell is empty continues a given number of times before the spliced portion is exposed to the suction area 48. Using this characteristic, in the electronic component mounting apparatus 10, as in the present embodiment, when the condition where the storage cell is empty continues a given number of times, by setting the mark alert mode to detect the mark with higher accuracy, the spliced portion can be detected with higher accuracy. Accordingly, detection failure of the spliced portion can be suppressed. Moreover, when the condition where the storage cell is empty does not continue a given number of times, by not setting the mark alert mode, that is, by changing the detection accuracy according to the empty cell detection condition, the overall processing amount can be reduced.

Moreover, in the electronic component mounting apparatus 10, it may be determined that the part is a spliced portion when the condition where the storage cell is empty continues the given number of times and the mark indicative of splicing is detected. By combining the two conditions that the condition where the storage cell is empty continues the given number of time and that the mark indicative of splicing is detected, the spliced portion can be detected with high accuracy. Specifically, the possibility can be reduced of a misdetection in which a scratch or the like made on the electronic component accommodating tape is detected as the mark indicative of splicing.

When the two conditions that the condition where the storage cell is empty continues the given number of time and that the mark indicative of splicing is detected are combined, in the electronic component mounting apparatus 10, detection of the mark indicative of splicing may be performed only in the mark alert mode, that is, only in a case where the condition where the storage cell is empty continues a given number of times. Thereby, the amount of processing can be reduced. As mentioned above, the spliced portion adjoins the part where the storage cells are continuously empty the given number of times. Thus, in the electronic component mounting apparatus 10, frequency of detection failure of the spliced portion can be suppressed also when the detection of the mark indicative of splicing is performed only in the mark alert mode, that is, only in a case where the condition where the storage cell is empty continues a given number of times.

In the electronic component mounting apparatus 10, by predetermining the number of continuous empty ones of the storage cells provided at the rear end portion and the front end portion of the electronic component accommodating tapes when two electronic component accommodating tapes are spliced, the connection part of the electronic component accommodating tapes can be detected more reliably.

Moreover, in the electronic component mounting apparatus 10, when empty cells continue a given number of times or more, by the error processing, the operator can be notified of the occurrence of a component shortage or the like. Moreover, in the electronic component mounting apparatus 10, by determining whether the part is a spliced portion based on the image, when empty cells continue a given number of times or more, whether it is because of splicing or a part shortage is occurring can be determined with high accuracy.

In the electronic component mounting apparatus 10, as described with reference to step S32, when it is determined that the part is a spliced portion and it is determined that the electronic component accommodating tape is changed, it is advantageous to analyze the position of the storage cell of the electronic component accommodating tape based on the image and automatically correct the pick position at the time of the suction of the electronic component. According to a typical splicing method, since tapes are manually connected, there are cases where a pitch error (error of the distance between storage cells) occurs at the connection part of the front end portion of the succeeding electronic component accommodating tape and the rear end portion of the preceding electronic component accommodating tape; however, the electronic components can be appropriately suctioned by correcting it.

In the electronic component mounting apparatus 10, by detecting whether the electronic component is reversed based on the captured image, the condition of the electronic component can be detected more appropriately. In the electronic component mounting apparatus 10, when it is determined that the electronic component is reversed (not in the correct position), by discarding the electronic component, the electronic component that is not in the correct position can be prevented from being mounted on the board. In the present embodiment, the electronic component is discarded when it is determined that the electronic component is reversed. However, this is not necessarily required. The reversal may be notified by an alarm or the like, or the mounting operation may be stopped temporarily. In the electronic component mounting apparatus 10, whether to make the determination as to whether the electronic component is reversed may be switched in accordance with the type of the electronic component to be mounted. For example, in the case of chip capacitors, the determination may not be performed as they can be mounted on either surface, and in the case of chip resistors, the detection of the reversal of faces may be performed based on the presence or absence of the face printing.

Moreover, in the electronic component mounting apparatus 10, it is advantageous to compare the electronic component and a non-defective item image (golden image) based on the image and recognize the component condition. Moreover, in the electronic component mounting apparatus 10, processing similar to the electronic device orientation determination may be performed based on the component condition. For example, the component may simply be mounted when the component condition is appropriate and the component may be discarded when the component condition is defective.

In the electronic component mounting apparatus 10, it is advantageous to adjust the brightness of the illumination by the first illuminator and the second illuminator based on the imaging condition of the image where the suction area is imaged. For example, when the recognition of the electronic component stored in the storage cell 108 is failed, the brightness of the illumination may be adjusted to capture and analyze an image again. The brightness of the illumination may be adjusted, for example, in seven levels.

In the electronic component mounting apparatus 10, it is advantageous to adjust the brightness of the illumination by the first illuminator and the second illuminator according to the condition of the electronic component accommodating tape such as the material of the electronic component accommodating tape. The condition of the electronic component accommodating tape can be detected by the acquisition of information associated with an input by the operator or the electronic component accommodating tape, the analysis of the image, or the like. In the electronic component mounting apparatus 10, when the spliced portion is detected and it is determined that the electronic component accommodating tape is changed, the brightness of the illumination by the first illuminator and the second illuminator is adjusted according to the condition of the electronic component accommodating tape. As the material of the electronic component accommodating tape, paper tape, embossed tape, black embossed tape and the like are available. The brightness of the illumination may be adjusted, for example, in seven levels, and the levels may be set according to the material of the electronic component accommodating tape (for example, four levels for paper tape, five levels for embossed tape, and six levels for others).

In the electronic component mounting apparatus 10, it is advantageous to store the relationship between the electronic component 44 mounted on the board 8 and the electronic component accommodating tape 100 holding the electronic component 44. For the electronic component, it is advantageous to further store information on mounting such as the component name, the component number, the mounting coordinates, the component size, the mounting head, the mounting nozzle, the feeder number and the mounting time so as to be associated therewith. Thereby, on which electronic component accommodating tape the electronic component 44 mounted on the board was stored can be found at a given time. Thereby, a traceability system with more information on the electronic component mounted on the board can be achieved, so that when a problem occurs with the electronic component mounted on the board, the cause can be traced with higher accuracy. For example, when a problem occurs with the electronic component mounted on one board, on which board the electronic components held by the same electronic component accommodating tape as the electronic component are mounted can be detected, and can be tested or replaced when necessary. Moreover, which board requires a test or replacement can be identified with high accuracy.

Moreover, in the electronic component mounting apparatus 10, when it is determined that the electronic component accommodating tape is changed, it is advantageous to update the information on the electronic component accommodating tape associated with the electronic component mounted on the board, that is, to update various pieces of information based on the changed lot data. By updating the information on the electronic component accommodating tape in accordance with the change of the electronic component accommodating tape, even when splicing is performed, the information on the electronic component accommodating tape to be associated can be accurately managed.

Moreover, for the mounted electronic component 44, it is advantageous that images before and after suction where the electronic component imaged by the camera unit 36 is imaged and images before and after mounting on the board are also stored so as to be associated. The associated image may be either any one of them or all of them. Moreover, it is not necessary to take all of the images before and after suction and the images before and after mounting on the board. By associating the captured images of the electronic component, a traceability system with more information on the electronic component mounted on the board can be achieved, so that when a problem occurs with the electronic component mounted on the board, the cause can be traced with higher accuracy.

While in the electronic component mounting apparatus 10, the image of the suction area captured by the camera unit 36 is analyzed to determine whether the electronic component 44 is present by the process operation shown in FIG. 14, this is not necessarily required. In the electronic component mounting apparatus 10, whether the electronic component 44 is present may be determined by the suction operation by the nozzle 32. That is, in the electronic component mounting apparatus 10, the nozzle 32 may be moved to the position where it can suction the electronic component 44 and may actually perform the suction operation to make the determination depending on whether the electronic component 44 is suctioned. The determination as to whether the electronic component 44 is suctioned can be made based on whether the suction pressure of the nozzle 32 and the amount of air suction by the nozzle 32 are changed. Moreover, they may be combined such that in a case where the idle feed counter is 0, i.e., when it is not detected that the storage cell is empty, the presence or absence of the electronic component may be determined by the suction operation, and in a case where it is detected that the storage cell is empty in the latest detection (the idle feed counter is equal to or more than 1), the image of the suction area captured by the camera unit 36 may be analyzed to determine whether the electronic component 44 is present.

Moreover, in the electronic component mounting apparatus 10, whether it is a spliced portion may be determined only when it is detected that the storage cell is empty in the latest detection (the idle feed counter is equal to or more than 1). As described above, on the electronic component accommodating tape, a given number of storage cells at the end portion are basically empty. Thus, even if the determination as to whether it is a spliced portion is made only when it is detected that the storage cell is empty in the latest detection (the idle feed counter is equal to or more than 1), the detection failure of the spliced portion can be suppressed. Moreover, when it is not detected that the storage cell is empty in the latest detection, by not detecting whether the part is a spliced portion, the amount of computation can be reduced, so that the amount of processing can be reduced. Moreover, as described above, by determining the presence or absence of the electronic component by the suction operation when it is not detected that the storage cell is empty (the idle feed counter is 0) and analyzing the image of the suction area captured by the camera unit 36 and combining it with the determination as to whether the electronic component 44 is present when it is detected that the storage cell is empty in the latest detection (the idle feed counter is equal to or more than 1), although the determination as to whether the electronic component is reversed cannot be made, a similar process operation can be executed without capturing and analyzing the image when it is not detected that the storage cell is empty (the idle feed counter is 0). Thereby, the processing amount can be reduced.

While in the electronic component mounting apparatus 10, the image of the suction area captured by the camera unit 36 is analyzed and whether the electronic component 44 is present, whether the electronic component 44 is in the correct orientation and whether the part is a spliced portion are determined by the process operation shown in FIG. 14, this is not necessarily required. The electronic component mounting apparatus 10 may be configured to analyze the image of the suction area captured by the camera unit 36 and to determine only whether it is a spliced portion. By determining whether it is a spliced portion, the electronic component mounting apparatus 10 can suitable detect the change of the electronic component accommodating tape. The electronic component mounting apparatus 10 may be configured to analyze the image of the suction area captured by the camera unit 36 and to determine only whether the electronic component is in the correct orientation.

Figure 17:
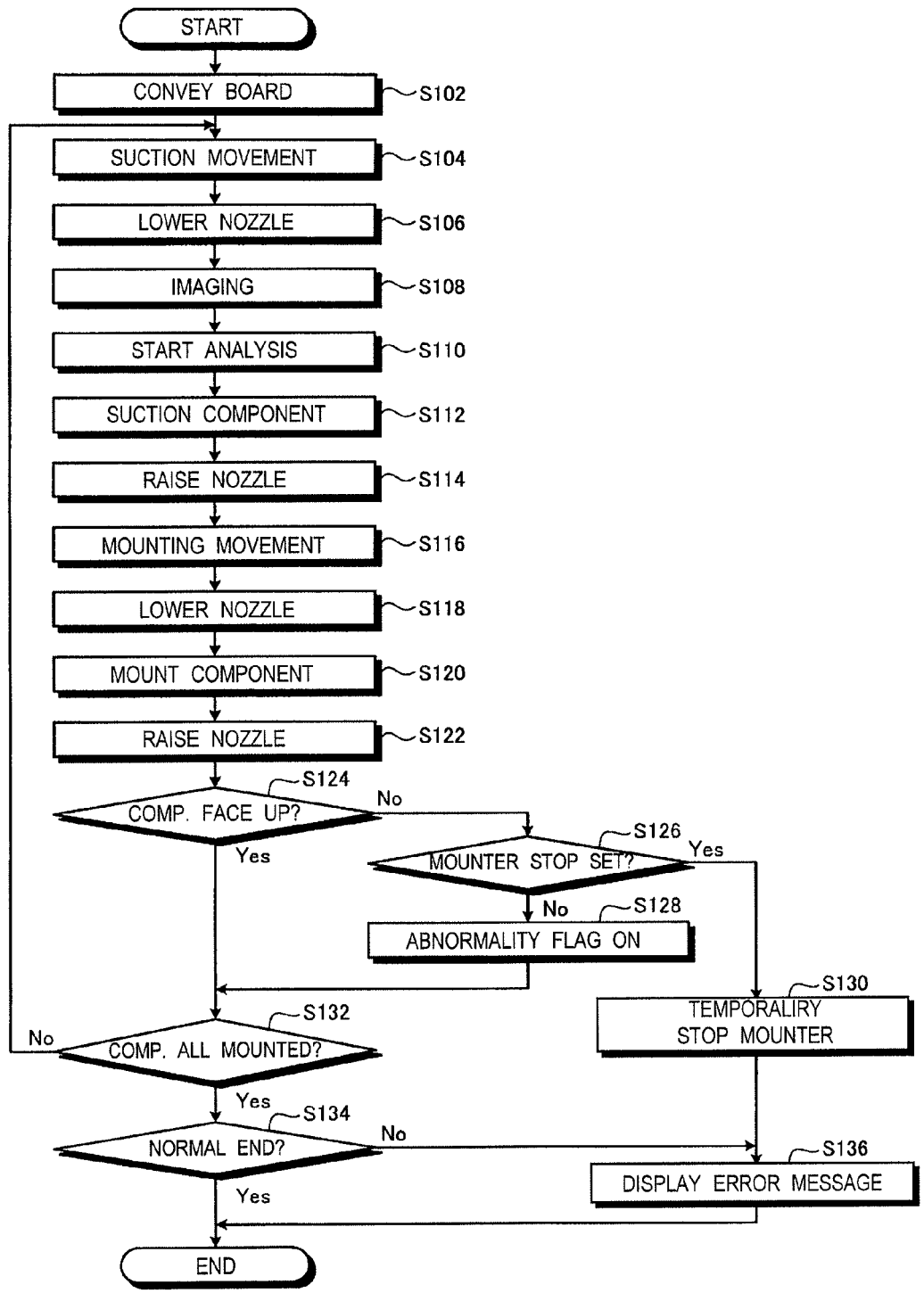
FIG. 17 is a flowchart illustrating an example of operations of the electronic component mounting apparatus.

FIG. 17 is a flowchart showing an example of the operation of the electronic component mounting apparatus. Hereinafter, a process operation will be described in which the image of the suction area captured by the camera unit 36 is analyzed and only whether the electronic component is in the correct orientation is determined. The process operation shown in FIG. 17 is an operation from the conveyance of the board to the completion of the mounting of the electronic component on the board or the termination due to an error. Moreover, the process operation shown in FIG. 17 is executed by the controller 212 controlling the operations of the members.

The controller 212 conveys the board (step S102). Specifically, the controller 212 conveys the board on which the electronic component is to be mounted, to a given position by the base conveyer 12. After conveying the board, the controller 212 performs the suction movement (step S104). The suction movement is a process operation of moving the head unit 30 to a position where the nozzle 32 faces the electronic component 44 situated in the suction area 48 in the component supply device 14.

After the suction movement, the controller 212 lowers the nozzle 32 (step S106). That is, the controller 212 moves the nozzle 32 downward to a position where it can suction the electronic component 44. After lowering the nozzle 32, the controller 212 performs imaging, that is, captures an image of the suction area 48 by the camera unit 36 (S108), and starts the analysis of the captured image of the suction area 48 (step S110). The process operation of step S106 may be executed after the process operations of step S108 and S110.

After starting the analysis at step S110, the controller 212 suctions the component by the nozzle 32 (step S112), raises the nozzle 32 (step S114), performs mounting movement, that is, a process operation of moving the electronic component suctioned by the nozzle 32 to a position facing the mounting position of the board (step S116), lowers the nozzle 32 (step S118), performs component mounting, that is, a process operation of releasing the electronic component 44 from the nozzle 32 (step S120), and raises the nozzle 32 (step S122). That is, the controller 212 executes the above-described mounting processing as the process operations of steps S112 to step S120.

After raising the nozzle at step S122, the controller 212 determines whether the component is facing up (step S124). That is, the controller 212 determines whether the electronic component in the captured image is facing up (in the correct orientation) based on the result of the image analysis started at step S110.

When the controller 212 determines that the electronic component is facing up at step S124 (step S124; Yes), the controller 212 proceeds to step S132. When the controller 212 determines that the electronic component is not facing up, that is, facing down at step S124 (step S124; No), the controller 212 determines whether mounter stop setting is made (step S126). That is, the controller 212 determines whether setting is made so that the electronic component mounting operation (various operations including the mounting processing) by the electronic component mounting apparatus 10 (mounter) is stopped when a faced-down electronic component is mounted on the board. Whether the mounter stop setting is ON or OFF can be set by an operation by the operator.

When the controller 212 determines that the mounter stop setting is not made, that is, the mounter stop setting is OFF and setting is not made so that the mounting operation of the electronic component mounting apparatus 10 is stopped at step S126 (step S126; No), the controller 212 sets an abnormality flag to ON (step S128), and proceeds to step S132. The abnormality flag is information representing that an inappropriate processing has been performed. Moreover, when the controller 212 determines that the mounter stop setting is made, that is, the mounter stop setting is ON and setting is made so that the mounting operation of the electronic component mounting apparatus 10 is stopped at step S126 (step S126; Yes), the controller 212 temporarily stops the mounter (electronic component mounting apparatus) (step S130), and proceeds to step S136.

Moreover, when the determination is Yes at step S124 or when the process operation of step S128 is performed, the controller 212 determines whether mounting of all the components has been completed, that is, whether the mounting of the electronic components to be mounted on the board has been completed (step S132). When the controller 212 determines that mounting of all the components has not been completed, that is, electronic components to be mounted are left at step S132 (step S132; No), the controller 212 proceeds to step S104 to execute the process operation of mounting the next electronic component on the board. Thus, the controller 212 repeats the above-described operation until mounting of all the components on the board is completed.

When the controller 212 determines that mounting of all the components has been completed at step S132 (step S132; Yes), the controller 212 determines whether the operation ended normally (step S134). The controller 212 is capable of determining whether the operation ended normally based on whether the abnormality flag is ON. When the controller 212 determines that the operation ended normally, that is, the abnormality flag is not ON at step S134 (step S134; Yes), the controller 212 ends the present processing. On the board for which it is determined that the operation ended normally and the processing ended, all the electronic components are mounted appropriately. When the controller 212 determines that the operation did not end normally, that is, the abnormality flag is ON at step S134 (step S134; No), the controller 212 proceeds to step S136. When the process operation of step S130 is executed or the determination is No at step S134, the controller 212 causes an error message to be displayed on a monitor or the like (step S136), and ends the present processing. The error message is, for example, information representing that the electronic component is mounted in an inappropriate condition and in a case where the process operation of step S130 has been executed, information representing that the mounter is stopped.

In the electronic component mounting apparatus 10, by executing the process operation shown in FIG. 17, the mounting condition of the electronic components is determined appropriately. In the electronic component mounting apparatus 10, by using the camera unit provided integrally with the head unit, the suction areas at various positions and the condition of the electronic component accommodating tape are detected by one camera unit as described above. Thereby, the number of components of the apparatus can be reduced.

In the electronic component mounting apparatus 10, by executing the process operation shown in FIG. 17, the image analysis is performed while the electronic component mounting operation is performed. Thereby, the image analysis and the mounting processing can be processed in parallel, the processing wait time can be reduced, and the processing speed can be increased. In the electronic component mounting apparatus 10, by turning off the mounter (electronic component mounting apparatus) stop setting, information on the mounting condition of the electronic component is accumulated while the operation of mounting the next electronic component is continued. In the electronic component mounting apparatus 10, by storing the captured images, the images of the faced-down electronic components can be checked in the post-process.

In the electronic component mounting apparatus 10, also in the process operation shown in FIG. 17, the determination as to whether the part is a spliced portion may be made based on the image captured at step S108. Thereby, it can be appropriately detected that the electronic component accommodating tape is changed. Moreover, the captured images can be effectively utilized. When the relationship between the electronic components mounted on the board and the electronic component accommodating tape holding the electronic components is stored, information on a similar correspondence relationship can be stored even when the processing is performed after mounting. Thereby, information on the electronic components mounted on the board can also be traced later.

While it is advantageous that two illuminators and a baffle are provided for one camera in the camera unit, this is not necessarily required. In so far as the camera unit is integrally provided on the head unit and is capable of capturing an image of the electronic component accommodating tape in the area including the storage cells where the electronic components to be suctioned are stored, i.e., the suction area in the component supply device 14, for example, the baffle may not be provided, or the number of illuminator may be one.

While one head 15 is provided in the embodiment described above, the present invention is not limited thereto, and a plurality of heads may be provided. For example, two heads 15 may be provided so that the electronic components 44 are alternately mounted on one board. By thus alternately mounting the electronic components 44 by the two head 15, while one head is mounting the electronic component 44 on the board, the other head can suction the electronic component 44 situated in the component supply device. Thereby, the time during which no electronic component 44 is mounted on the board can be made shorter, so that the electronic components 44 can be mounted efficiently.

What is claimed is:

1. An electronic component mounting apparatus configured to mount an electronic component on a board, the electronic component mounting apparatus comprising:
a head unit comprising a nozzle configured to suction the electronic component, a nozzle driver configured to drive the nozzle, and a head support supporting the nozzle and the nozzle driver;
a component supply device comprising a holder configured to hold a plurality of electronic component accommodating tapes, each having storage cells arranged in a row, the storage cells storing electronic components, and a feeder configured to forward the electronic component accommodating tapes and to move the storage cells to a suction area where the electronic component can be suctioned by the nozzle;
a camera unit fixed to the head support to capture an image of the suction area; and
a controller configured to control operations of the head unit and the component supply device,
wherein the controller is configured to analyze the image of the suction area in the component supply device obtained by the camera unit, determine whether a portion of the electronic component accommodating tape in the suction area is a spliced portion based on a result of the analysis, and to determine that the electronic component accommodating tape is changed if the portion of the electronic component accommodating tape in the suction area is determined to be the spliced portion.

2. The electronic component mounting apparatus according to claim 1, wherein, when the controller detects a mark indicative of splicing on the portion of the electronic component accommodating tape in the suction area, the controller determines that the portion of the electronic component accommodating tape in the suction area is the spliced portion.

3. The electronic component mounting apparatus according to claim 1, wherein, when the controller determines that the electronic component accommodating tape is changed, the controller controls the feeder to forward the electronic component accommodating tape by an amount corresponding to a given number of storage cells.

4. The electronic component mounting apparatus according to claim 1, wherein the controller analyzes the image of the suction area in the component supply device obtained by the camera unit to determine whether the electronic component is in the storage cell of the electronic component accommodating tape.

5. The electronic component mounting apparatus according to claim 4, wherein, when the controller determines that no electronic component is in the storage cell, the controller controls the feeder to forward the electronic component accommodating tape by an amount corresponding to one storage cell.

6. The electronic component mounting apparatus according to claim 5, wherein, when the controller determines that the electronic component is in the storage cell, the controller controls the head unit to suction the electronic component in the storage cell by the nozzle and to mount the electronic component suctioned by the nozzle on the board.

7. The electronic component mounting apparatus according to claim 5, wherein, when the controller determines that the electronic component is in the storage cell, the controller analyzes the image of the suction area in the component supply device obtained by the camera unit to determine whether the electronic component in the storage cell is facing up or down.

8. The electronic component mounting apparatus according to claim 7, wherein when the controller determines that the electronic component in the storage cell is facing up, the controller controls the head unit to suction the electronic component in the storage cell by the nozzle and to mount the electronic component suctioned by the nozzle on the board, and
when the controller determines that the electronic component in the storage cell is facing down, the controller controls the head unit to suction the electronic component in the storage cell by the nozzle and to discard the electronic component suctioned by the nozzle.

9. The electronic component mounting apparatus according to claim 1, wherein the controller stores a relationship between the electronic component mounted on the board and the electronic component accommodating tape that was holding the electronic component, and
when the controller determines that the electronic component accommodating tape is changed, the controller updates information on the electronic component accommodating tape associated with the electronic component mounted on the board.

10. The electronic component mounting apparatus according to claim 1, wherein the camera unit comprises:
a camera module comprising a camera configured to capture the image, a first illuminator disposed adjacent to a side of the camera closer to the nozzle to radiate light toward the area where the image is captured by the camera, a second illuminator disposed adjacent to a side of the camera farther from the nozzle to radiate light toward the area where the image is captured by the camera, and a baffle that intercepts a part of the light radiated from the first illuminator; and
a bracket fixed to the head support, the bracket supporting the camera, the first illuminator, the second illuminator and the baffle.

11. The electronic component mounting apparatus according to claim 10, wherein a plurality of said nozzles are arranged in a row on the head unit,
the camera unit includes a plurality of said camera modules arranged to correspond to the respective nozzles, and
the camera module is configured such that the camera, the first illuminator and the second illuminator are aligned parallel to a direction in which the nozzles are arranged.

12. The electronic component mounting apparatus according to claim 1, further comprising:
a conveyer configured to convey the board to a position where the head unit mounts the electronic component on the board; and
a movement mechanism configured to move the head unit along a plane parallel to a surface of the board.

13. The electronic component mounting apparatus according to claim 1, wherein the camera unit comprises a camera configured to capture the image, the camera being arranged in an inclined manner with respect to a direction in which the nozzle is moved by the nozzle driver.

* * * * *